(12) United States Patent
Lin et al.

(10) Patent No.: US 11,462,469 B2
(45) Date of Patent: Oct. 4, 2022

(54) SINGLE MASK LITHOGRAPHY LINE END ENHANCEMENT

(71) Applicant: INTEL CORPORATION, Santa Clara, CA (US)

(72) Inventors: Kevin L. Lin, Beaverton, OR (US); Nafees A. Kabir, Portland, OR (US); Richard Schenker, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 860 days.

(21) Appl. No.: 16/143,700

(22) Filed: Sep. 27, 2018

(65) Prior Publication Data

US 2020/0105662 A1  Apr. 2, 2020

(51) Int. Cl.
*H01L 23/522* (2006.01)
*H01L 21/768* (2006.01)
*H01L 23/532* (2006.01)

(52) U.S. Cl.
CPC .... *H01L 23/5226* (2013.01); *H01L 21/76834* (2013.01); *H01L 21/76849* (2013.01); *H01L 23/53295* (2013.01)

(58) Field of Classification Search
CPC ........... H01L 23/5226; H01L 23/53295; H01L 21/76834; H01L 21/76849
USPC .......................................................... 257/774
See application file for complete search history.

(56) References Cited

U.S. PATENT DOCUMENTS 9,960,110 B2    5/2018  Boyanov
2015/0162238 A1*  6/2015  Huang ................ H01L 21/0335
                                                              438/674

* cited by examiner

*Primary Examiner* — Tu-Tu V Ho
(74) *Attorney, Agent, or Firm* — Schwabe, Williamson & Wyatt P.C.

(57) ABSTRACT

Techniques are disclosed that enable independent control of interconnect lines and line end structures using a single mask. The techniques provided are particularly useful, for instance, where single mask lithography processes limit the scaling of line end structures. In some embodiments, the techniques can be implemented using a liner body and multiple angled etches of the liner body to provide a line end structure comprised of a remaining portion of the liner body. In such cases, the line end structure material enables an etch rate that is slower than the etch rate of surrounding insulator materials. Furthermore, the line end structure can be of minimal size not attainable using conventional single mask processes. In other embodiments, the techniques can be implemented using a hardmask that includes hardmask features defining lines, and one or more angled etches of the hardmask to provide line end structure(s) of minimal size.

28 Claims, 15 Drawing Sheets

SINGLE MASK LITHOGRAPHY LINE END ENHANCEMENT

BACKGROUND

As integrated circuits continue to down-scale into the lower nanometer range, continued feature scaling is necessary to provide both lower cost and improved performance. For example, a typical large-scale integrated circuit can include more than thirty miles of interconnect lines, which form metal interconnect wires in multiple, stacked levels. These wires, also known as interconnects, connect the transistors and other features in the integrated circuit to one another and make the transistors and features functional. With the continued down-scaling of feature dimensions in integrated circuits, generating interconnect lines with minimal spacing becomes important for keeping up with the pace of scaling. However, generating interconnect lines with minimal spacing is very difficult and involves a number of non-trivial issues.

BRIEF DESCRIPTION OF THE DRAWINGS

FIGS. 4A'-4H' illustrate cross-sectional views of the structure of FIG. 4 when carrying out the process of FIG. 3, in accordance with an embodiment of the present disclosure. The illustrated cross-sectional views are of the structure of FIG. 4 at the B-B' axis.

FIGS. 6A'-6C' illustrate cross-sectional views of the structure of FIG. 6 when carrying out the process of FIG. 5, in accordance with an embodiment of the present disclosure. The illustrated cross-sectional views are of the structure of FIG. 6 at the B-B' axis.

Figure 1:
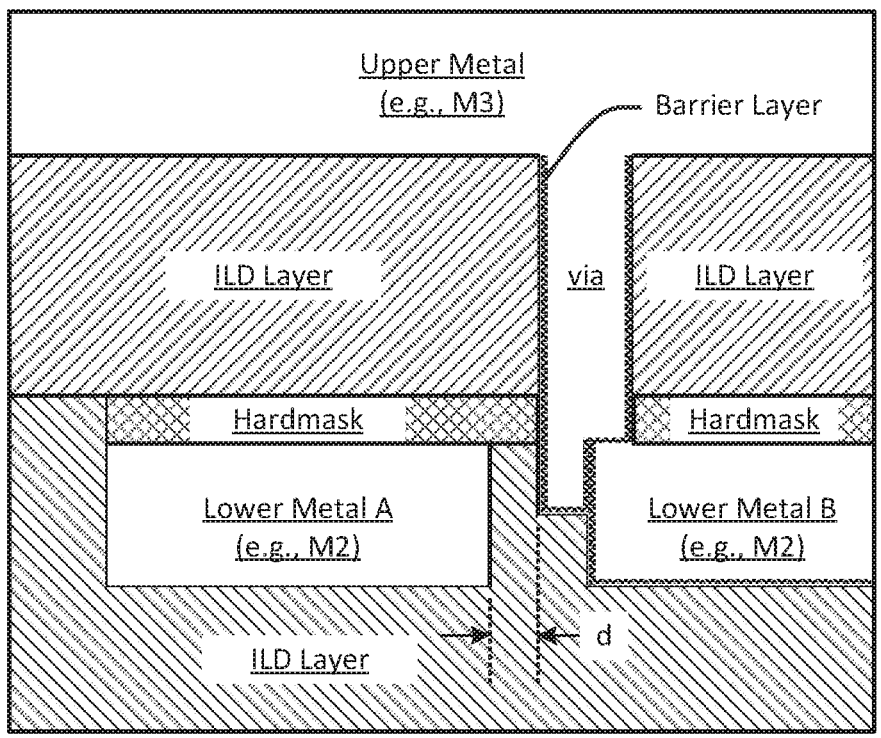
FIG. 1 illustrates an example stacked conductive interconnect feature showing an unlanded via.

These and other features of the present embodiments will be understood better by reading the following detailed description, taken together with the figures herein described. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

Techniques are disclosed that enable independent control of conductive interconnect lines (interchangeably referred to herein as lines) and line ends using a single mask. As will be appreciated in light of this disclosure, single mask lithography is used to pattern metal lines and line ends, and one or more directional or so-called angled etches are used to provide independent control of the metal lines and line ends. As used herein, a line end (or line end structure) is a body of semiconductor material at an end of a metal line that separates the metal line form another laterally adjacent metal line. In some such embodiments, angled or so-called directional etches can be used to decrease the size (e.g., length) of a line end structure while not (or only minimally) affecting the size (e.g., width) of a metal line laterally adjacent to the line end structure. In other embodiments, angled etches can be used to increase the size (e.g., width) of a metal line while not (or only minimally) affecting the size (e.g., length) of a line end structure laterally adjacent to an end of the metal line. In a more general sense, the techniques provided herein allow for control of adjacent end-to-end metal lines (with respect to dimension and shape) independent of the line end structures between those lines, and vice versa. The techniques provided herein are particularly useful, for instance, when lithography registration limits hinder or otherwise prohibit control of line end structures independent of the metal lines using a single mask. In some embodiments, the single mask techniques are implemented to generate line end structures composed of a material that is compositionally different than the interlayer dielectric material (insulator material) on and/or in which the line end structures and lines are formed. In particular, the overall etch rate of the line end structure material is slower than the etch rate of the surrounding insulator material. This results in a line end structure that is effectively etch resistive during subsequent processes, such as etching of the insulator material to form vias. Because of its etch resistance, the line end structure is able to prevent shorting between adjacent metal lines. The resulting compositionally different line end structures provide relatively less variability in the sizes of the line end structures, and more reliable materials in regions of the integrated circuit generally more susceptible to failures. Note, however, that the relative less variability in the sizes of the lined end structures can be achieved without use of the compositionally different material, in accordance with some embodiments.

General Overview

As previously explained, generating lines with minimal spacing is important for continued integrated circuit scaling. To this end, it is desirable to generate line end structures of smaller or otherwise minimal size. The scaling of conventional single mask processes to provide smaller line end structures can be difficult because of, for example, lithography registration limits. For instance, any etch bias that affects the size of a line end structure (e.g., shrinks or enlarges the line end structure) will affect the lines. Such interdependence or coupling of lines and line end structures become more important to scaling with single layer extreme ultraviolet (EUV) patterning. Multi-patterning techniques have been proposed for generating line end structures without significantly affecting the lines. With multi-patterning, closely located features, such as lines and line end structures, can be separated to two masks, which are then used to pattern the same hardmask. For example, the lines can be printed using one lithographic patterning iteration, and the line end structures can be printed using a different lithographic patterning iteration. However, multi-patterning processes typically involve strict design rules specific to the lithographic techniques because of the complex interactions between the lithographic patterning iterations. Therefore, while multi-patterning may be adequate for providing line end structures independent of lines, such techniques are not without issues.

Thus, and in accordance with an embodiment of the present disclosure, techniques are provided for independent control of interconnect lines and line end structures using a single mask. In some embodiments, the techniques are implemented using a single mask lithography process, such as an extreme ultraviolet (EUV) process, to provide control of line end structures independent of the lines during formation of such conductive interconnect features. In particular, in some such embodiments, lines are patterned onto a hardmask and transferred to a body of insulator material, such as an interlayer dielectric (ILD) layer. An etch is then performed to provide a corresponding pattern of line trenches in the ILD. Then, a liner or a body (of liner material) is conformally deposited on the ILD, including the bottom and sides of the line trenches. Note that, in such embodiments, the liner material becomes the line end structure material (e.g., the material that forms the line end structure). Use of the liner to create the line end structures allows the line end structures to be of a compositionally different material than the ILD material. For instance, in some example embodiments, the ILD can be silicon dioxide ($SiO_2$) and the liner material can be a "hard" (non-leaky) metal oxide such as hafnium oxide ($HfO_2$), aluminum oxide ($Al_2O_x$), zirconium oxide ($ZrO_x$), or other suitable hard insulator materials. Hard or non-leaky metal oxides, including hard or non-leaky insulators, are characterized as having relatively low leakage current as compared to leaky metal oxides, for instance. An etch is then performed to remove the horizontally deposited liner material on the top surface of the hardmask and the bottom surfaces of the line trenches. Note that the horizontally deposited liner material is relatively thicker than the vertically deposited liner material on the sidewalls of the line trenches. Then, three angled etches are performed to remove the vertically deposited liner material on three of the four sidewalls of the line trenches, leaving only the liner material deposited on one sidewall (e.g., the fourth sidewall) of the line trenches. For instance, in such cases, a first angled etch from a first distribution of angles can be performed to remove the liner material on a first sidewall of the line trenches, a second angled etch from a second distribution of angles can be performed to remove the liner material on a second sidewall of the line trenches, and a third angled etch from a third distribution of angles can be performed to remove the liner material on a third sidewall of the line trenches. A final angled etch is then performed to remove the hardmask and ILD to expose the liner to function as (serve as) line end structure(s). Note that the angled etches that remove the vertically deposited liner material do not (or only minimally) affect or modify the lines, such that the dimensions (e.g., widths) of the lines are substantially maintained after the angled etching. This allows for generating line end structures of a minimum size using a single mask beyond the minimum sizes achievable using conventional single mask processes, such as single mask lithography processes. To this end, minimum sizes (lengths) of line end structures that can be achieved using the single mask techniques described herein include, for example, 25 nm, 24 nm, 23 nm, 22 nm, 21 nm, 20 nm, 19 nm, 18 nm, 17 nm, 16 nm, 15 nm, 14 nm, 13 nm, 12 nm, 11 nm, 10 nm, and smaller.

In some embodiments, one or more angled etches are used to independently control lines and line end structures without the use of a liner or a body (of liner material). In some such embodiments, a hardmask including hardmask features defining lines is transferred to a body of insulator material, such as an ILD layer. Then, a first angled etch of the hardmask can be performed to remove portions of a sidewall of a hardmask feature defining a line to decrease a size (e.g., length) of a line end structure laterally adjacent to the etched sidewall of the hardmask feature. Note that removing portions of the sidewall of the hardmask feature defining the line causes a corresponding lengthening of the hardmask feature, which results in a corresponding lengthening of the line defined by the hardmask feature. However, the variation to the line length should be minimal given the feature scaling. Otherwise, the angled etch does not (or only minimally) affect or modify the width of the hardmask feature defining the line and/or widths of other hardmask features included in the hardmask. In a more general sense, the angled etching of a hardmask feature, such as a hardmask feature defining a line, provides independent control of the horizontal dimensions (e.g., length and width) of the hardmask feature (e.g., control of the length of the line independent of the width of the line, and vice versa). In some embodiments, an additional second angled etch of the hardmask can be performed to remove portions of a sidewall of a laterally adjacent hardmask feature to decrease the size (e.g., length) of the line end structure from a side opposite the side reduced by the first angled etch. In any case, an etch can then be performed to form a corresponding pattern of structures (e.g., line trenches) defined by the hardmask features on and/or in the ILD. This allows for using a single mask to generate line end structures of a minimum size that is beyond the minimum sizes of line end structures that can be patterned using conventional single mask processes.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF- SIMS); atom probe imaging or tomography; local electrode atom probe (LEAP) techniques; 3D tomography; or high resolution physical or chemical analysis, to name a few suitable example analytical tools. In particular, in some embodiments, such tools may indicate the presence of a line end structure of a compositionally different material than the surrounding insulator material, such as the interlayer dielectric, as described herein. For example, TEM can be useful to show a cross section of the device structure, including line end structures of a compositionally different material and/or a minimal size beyond the minimum sizes achievable by conventional lithography processes, such as 193 nm immersion lithography processes. Numerous configurations and variations will be apparent in light of this disclosure.

Materials that are compositionally different as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally different may further refer to two materials that have different crystallographic orientations. For instance, (110) silicon is different from (100) silicon. Creating a stack of different orientations could be accomplished, for instance, with blanket wafer layer transfer.

It is noted that designations such "above" or "below" or "top" or "bottom" or "top side" or "bottom side" are not intended to necessarily implicate a limitation as to orientation of the embodiments described herein. Rather, such terminology is simply used in a relative sense to consistently describe a structure as it exists in any one particular orientation and as illustrated herein.

System Architecture

FIG. 1 illustrates an example stacked conductive interconnect feature showing an unlanded via. Specifically, FIG. 1 shows an example interconnect structure illustrating a problematic shifting of features associated with lithography registration errors. As can be seen, the via intended to connect an upper metal (e.g., M1) with a lower metal B (e.g., M2) is misaligned and therefore shifted closer to a neighboring lower metal A, thereby leaving a reduced distance between the conductive features. This reduced spacing can lead to insufficient shorting margin and decreased time-dependent dielectric breakdown (TDDB), or even a complete short-circuit. Note that even when the via does not completely short to the neighboring conductor, the distance can be decreased to a point where the thin insulator that separates the via and the neighboring lower metal A is not capable of withstanding the typical fields generated by, for instance, a ~1V power supply. This can result in yield fallout in the case of shorting, or a reliability marginality when the space 'd' is incapable of supporting the operating field. In some cases, as can be seen, the via may include a barrier layer or liner comprising a barrier material that inhibits migration of metal (M1 and/or M2) into the ILD layer, such as tantalum (Ta) or tantalum nitride (TaN), for example. To this end, a via may include multiple components or otherwise be a composite of materials, and need not be a single material, as will be appreciated. As will be further appreciated, while specific example via and metal layers are used here for illustration purposes, numerous other such arrangements will be apparent. In addition, such an arrangement can exist at any metal layers (e.g., M1 through M9, etc.) and in a more general sense, in any integrated circuit structure having multiple layers of conductive features susceptible to insufficient shorting margin resulting from lithography registration errors and/or high packing density.

Figure 2:
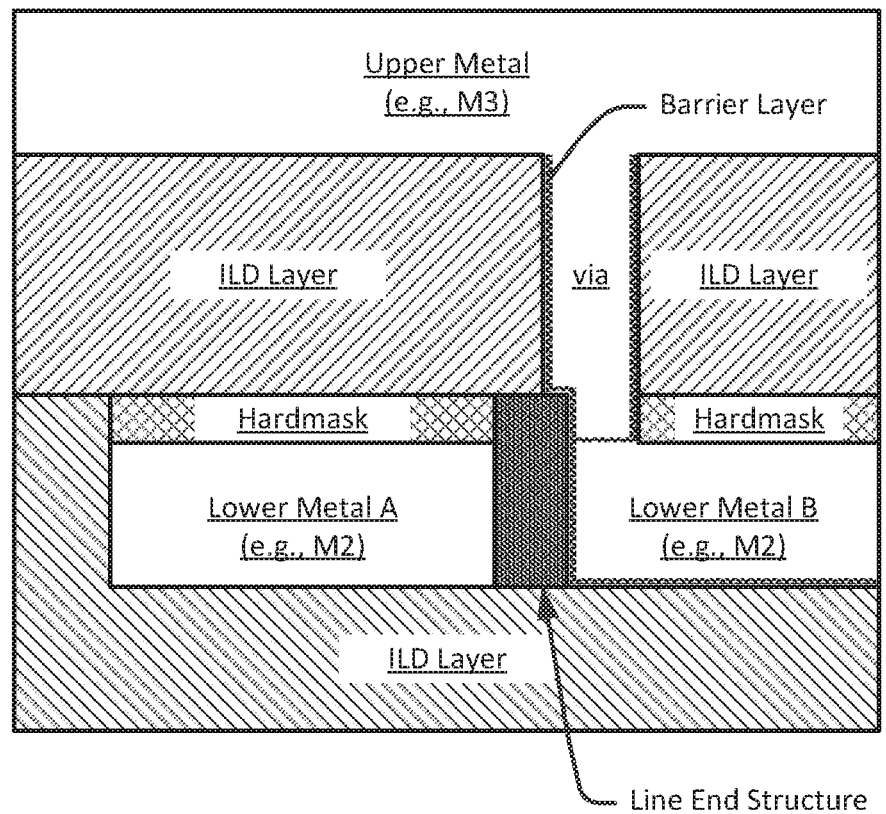
FIG. 2 illustrates an example stacked conductive interconnect feature showing a line end structure comprised of a compositionally different material, in accordance with an embodiment of the present disclosure.

FIG. 2 illustrates an example stacked conductive interconnect feature showing a line end structure comprised of a compositionally different material, in accordance with an embodiment of the present disclosure. As can be seen, the line end structure separates lower metal A and lower metal B and includes a material that is compositionally different than the material of the ILD layer. For instance, the line end structure may be at the neighboring or laterally adjacent ends of the lines defined by lower metal A and lower metal B, and define an end-to-end space between the laterally adjacent ends lower metal A and lower metal B. In some embodiments, the line end structure may include any suitable hard (non-leaky) metal oxide, such as $HfO_2$, $Al_2O_x$, and $ZrO_x$, to name a few examples. In such example embodiments, the compositionally different material of the line end structure enables an etch rate that is slower than the etch rate of the surrounding insulator material or materials. As will be appreciated in light of this disclosure, the slower etch rate may result from the material composition of the line end structure. Thus, when an unlanded via or other conductive interconnect feature is patterned and etched in the ILD layer, the etch rate is generally uniform until such compositionally different material of the line end structure is encountered. However, the compositionally different material of the line end structure etches more slowly (e.g., is etch resistive) than the surrounding insulator material, thereby providing a sufficient shorting margin (e.g., decrease in shorting risk).

Methodology

Figure 3:
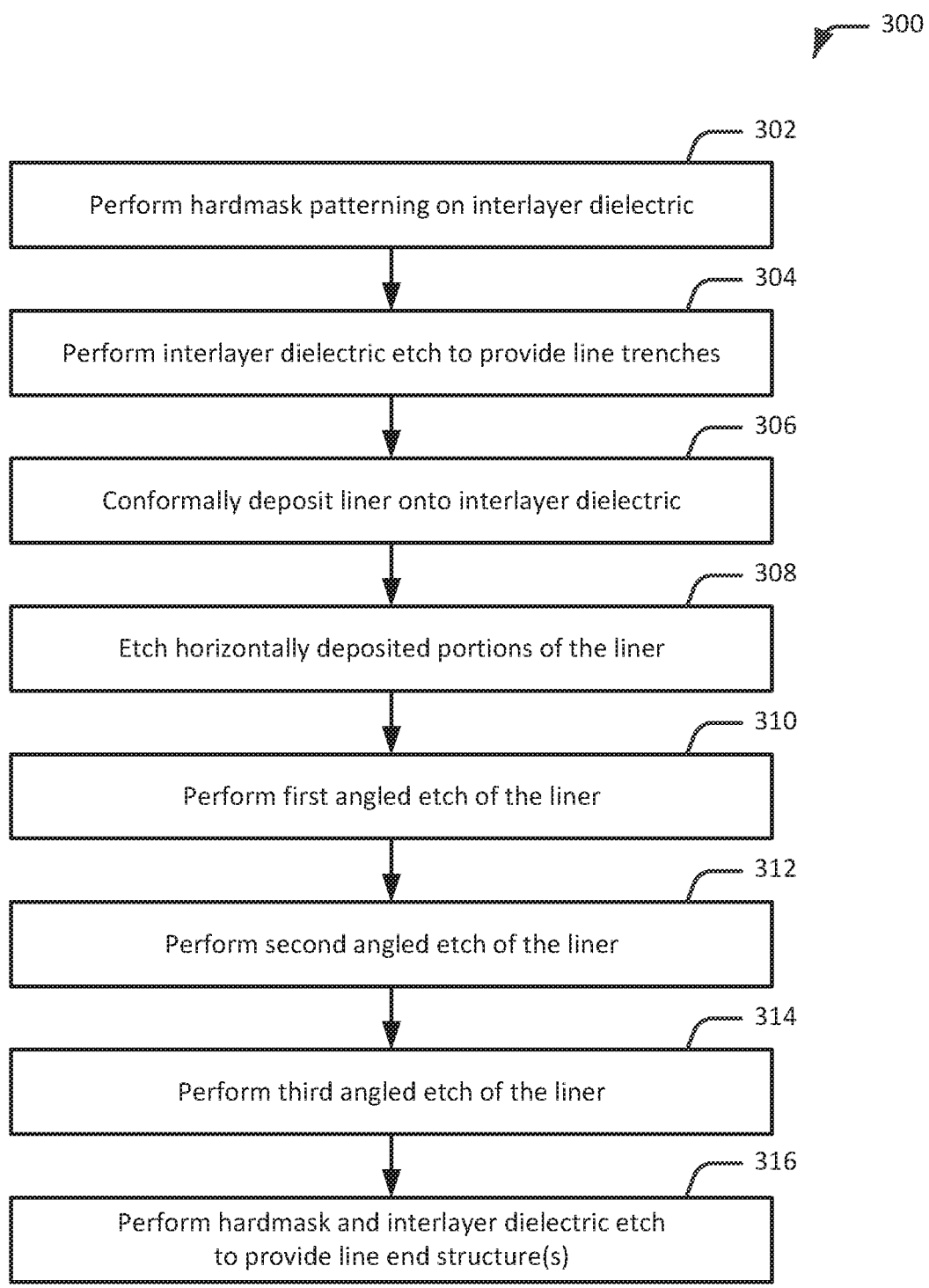
FIG. 3 is a flow diagram illustrating an example process for forming a line end structure composed of a compositionally different material, in accordance with an embodiment of the present disclosure.
Figure 4:
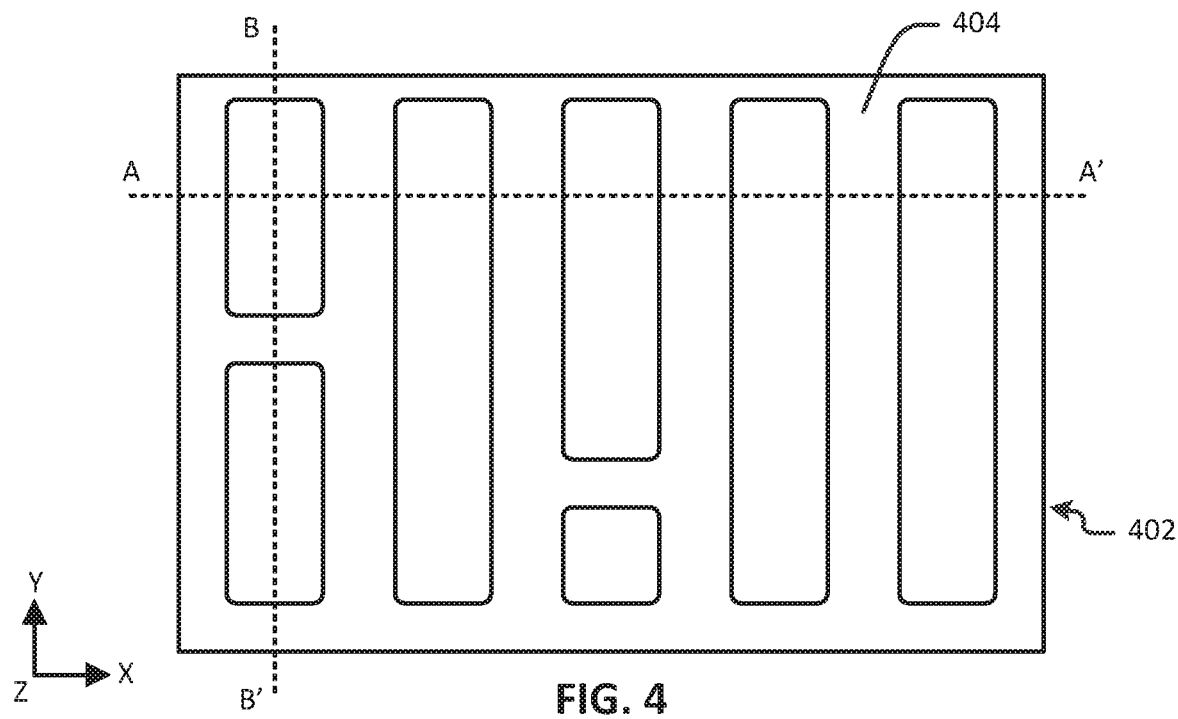
FIG. 4 illustrates a top view of an example integrated circuit structure that can be processed with the process of FIG. 3, in accordance with an embodiment of the present disclosure.
Figure 4A:
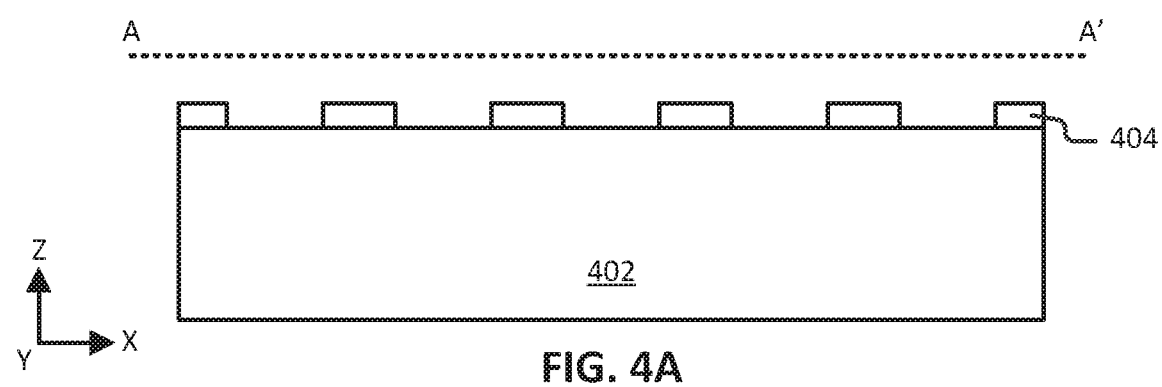
FIGS. 4A-4H illustrate cross-sectional views of the structure of FIG. 4 when carrying out the process of FIG. 3, in accordance with an embodiment of the present disclosure. The illustrated cross-sectional views are of the structure of FIG. 4 at the A-A' axis.
Figure 4A:
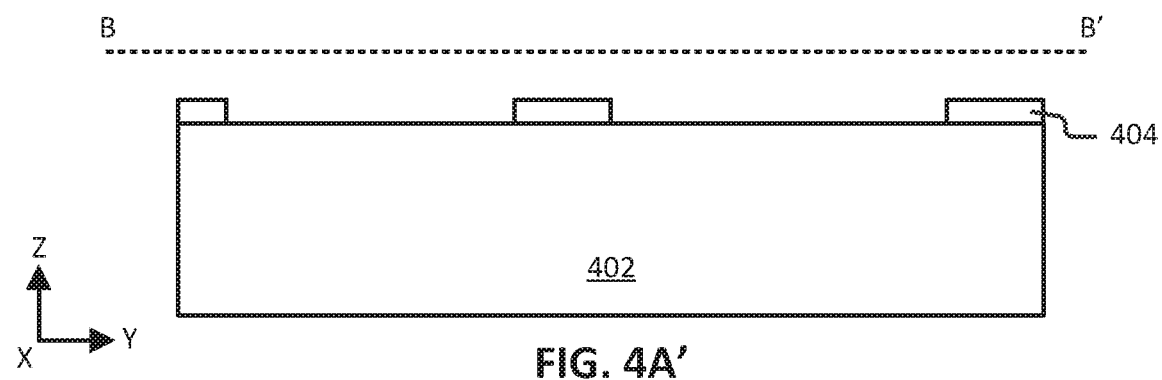

FIG. 3 is a flow diagram illustrating an example process 300 for forming a line end structure composed of a compositionally different material, in accordance with an embodiment of the present disclosure. FIG. 4 illustrates a top view of an example integrated circuit structure that can be processed with process 300 of FIG. 3, in accordance with an embodiment of the present disclosure. FIGS. 4A-4H illustrate cross-sectional views of the structure of FIG. 4 when carrying out process 300 of FIG. 3, in accordance with an embodiment of the present disclosure. The cross-sectional views illustrated in FIGS. 4A-4H are of the structure of FIG. 3 at the A-A' axis. FIGS. 4A'-4H' illustrate cross-sectional views of the structure of FIG. 4 when carrying out process 300 of FIG. 3, in accordance with an embodiment of the present disclosure. The cross-sectional views illustrated in FIGS. 4A'-4H' are of the structure of FIG. 3 at the B-B' axis. As will be further appreciated in light of this disclosure, for this and other processes and methods disclosed herein, the outlined actions and operations are only provided as examples, and some of the actions and operations may be optional, combined into fewer actions and operations, or expanded into additional actions and operations without detracting from the essence of the disclosed embodiments. Concurrent reference to FIG. 3 and FIGS. 4, 4A-4H, and 4A'-4H' will facilitate explanation.

A multitude of different transistor devices can benefit from the techniques described herein, which includes, but is not limited to, various field-effect transistors (FETs), such as metal-oxide-semiconductor FETs (MOSFETs), tunnel FETs (TFETs), and Fermi filter FETs (FFFETs) (also known as tunnel source MOSFETs), to name a few examples. For example, the techniques can be used to benefit an n-channel MOSFET (NMOS) device. In another example, the techniques can be used to benefit an p-channel MOSFET (PMOS) device. The techniques can be used to benefit transistors including a multitude of configurations, such as planar and/or non-planar configurations, where the non-planar configurations may include finned or FinFET configurations (e.g., dual-gate or tri-gate), gate-all-around (GAA) device configurations (e.g., employing one or more nanowires or nanoribbons), or some combination thereof (e.g., a beaded-fin configuration), to provide a few examples. Further, the techniques are used in some embodiments to benefit complementary transistor circuits, such as complementary MOS (CMOS) circuits, where the techniques may be used to benefit one or more of the included n-channel transistors making up the CMOS circuit. Other example transistor devices that can benefit from the techniques described herein include few to single electron quantum transistor devices, in accordance with some embodiments. Further still, any such devices may employ semiconductor materials that are three-dimensional crystals as well as two dimensional crystals or nanotubes, for example. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond).

Note that deposition or epitaxial growth techniques (or more generally, additive processing) where described herein can use any suitable techniques, such as chemical vapor deposition (CVD), physical vapor deposition (PVD), atomic layer deposition (ALD), and/or molecular beam epitaxy (MBE), to provide some examples. Also note that etching techniques (or more generally, subtractive processing) where described herein can use any suitable techniques, such as wet and/or dry etch processing which may be isotropic (e.g., uniform etch rate in all directions) or anisotropic (e.g., etch rates that are orientation dependent), and which may be non-selective (e.g., etches all exposed materials at the same or similar rates) or selective (e.g., etches different materials that are exposed at different rates). Further note that other processing may be used to form the integrated circuit structures described herein as will be apparent in light of this disclosure, such as hardmasking, patterning or lithography (via suitable lithography techniques, such as, e.g., photolithography, extreme ultraviolet lithography, x-ray lithography, or electron beam lithography), planarizing or polishing (e.g., via chemical-mechanical planarization (CMP) processing), doping (e.g., via ion implantation, diffusion, or including dopant in the base material during formation), and annealing, to name some examples.

With reference to process 300 of FIG. 3, at block 302, hardmask patterning for line formation on an interlayer dielectric is performed. FIG. 4 shows a top view of an example dielectric layer or body 402 after patterning with a hardmask 404. FIG. 4A shows dielectric layer 402 at the A-A' axis after patterning with hardmask 404, and FIG. 4A' shows dielectric layer 402 at the B-B' axis after patterning with hardmask 404. As will be appreciated, dielectric layer 402 may be formed as part of, or otherwise on, a substrate and may be configured in a number of ways and using any number of materials, as will be appreciated in light of this disclosure. Dielectric layer 402 can include any suitable insulator material, such as a nitride, an oxide, an oxynitride, a carbide, an oxycarbide, a polymer, a silane, a siloxane, or other suitable insulator material. Hardmask 404 can be provisioned on dielectric layer 402 using any number of suitable processes as normally done. For instance, in some embodiments, hardmask 404 can be provided using EUV lithography, including deposition of or more hardmask materials (e.g., such as silicon dioxide, silicon nitride, and/or other suitable hardmask materials), patterning resist on a portion of the hardmask that will remain temporarily to protect an underlying region of dielectric layer 402, etching to remove the unmasked (no resist) portions of the hardmask (e.g., using a dry etch, or other suitable hardmask removal process), and then stripping the patterned resist material, thereby leaving the patterned hardmask 404. Any number of suitable mask configurations can be used, as will be apparent.

Figure 4B:
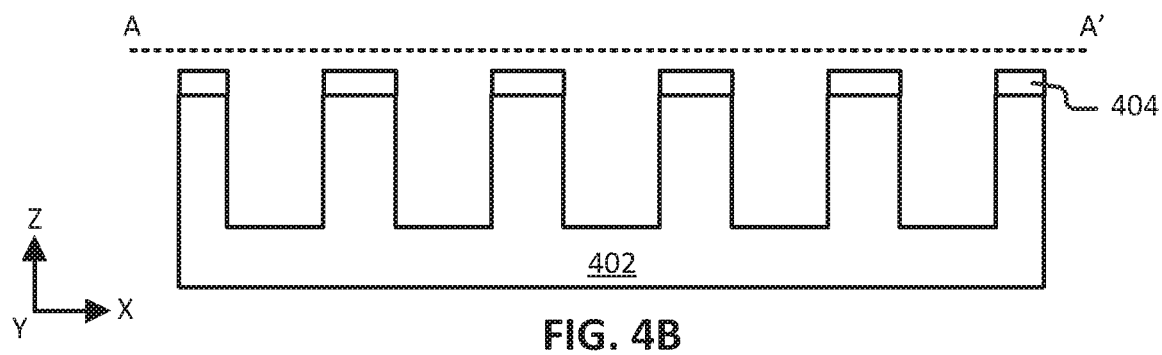
Figure 4B:
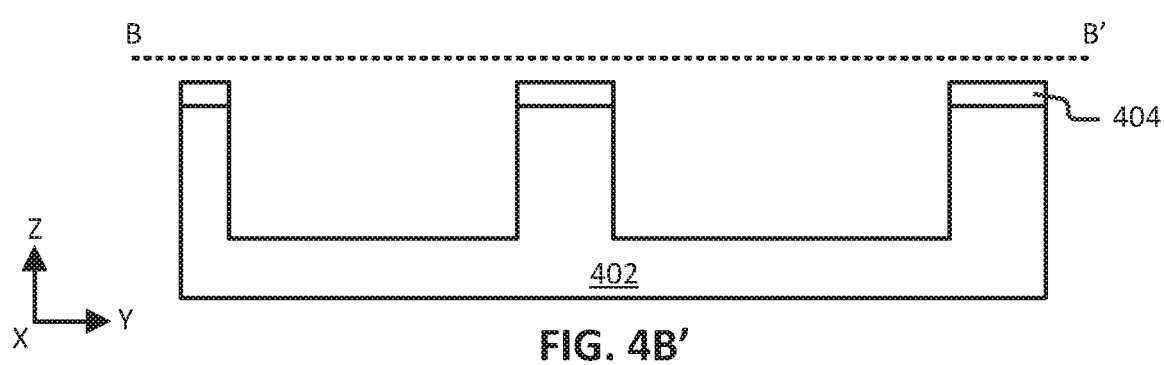

At block 304, interlayer dielectric 402 is etched to provide the line trenches. FIG. 4B shows dielectric layer 402 at the A-A' axis after the etching to provide the line trenches, and FIG. 4B' shows dielectric layer 402 at the B-B' axis after the etching to provide the line trenches. Although only five line trenches are shown at the A-A' axis and two line trenches shown at the B-B' axis, any number of line trenches can be provisioned. Any suitable etch processes can be used to etch the line trenches (e.g., wet and/or dry, isotropic and/or anisotropic, etc.). For example, the line trenches shown at the A-A' axis depict the widths of the respective line trenches as extending along an x-direction, and the line trenches shown at the B-B' axis depict the lengths of the respective line trenches as extending along a y-direction. Note that the dimensions of the line trenches, such as the width (dimension in the x-direction), length (dimension in the y-direction), depths (dimension in the z-direction), end-to-end spacing, etc., can vary as can be understood based on this disclosure.

Figure 4C:
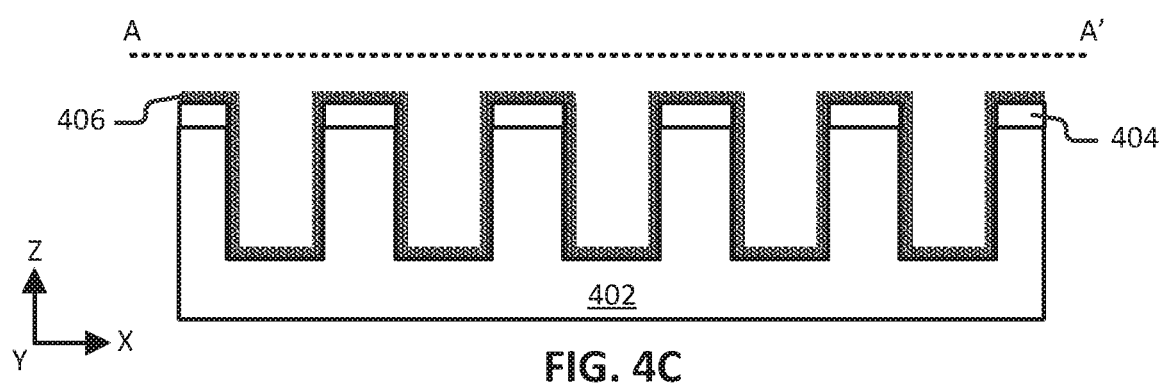
Figure 4C:
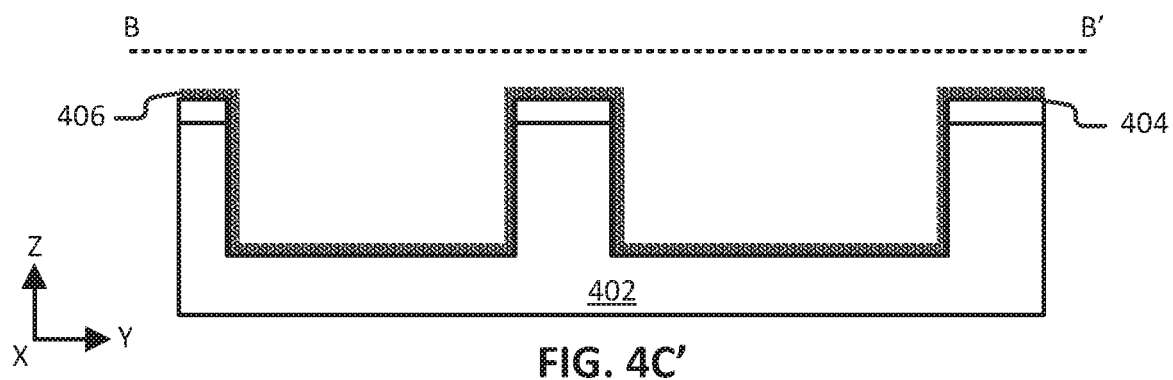

At block 306, a liner, such as a liner or body 406, is conformally deposited onto the interlayer dielectric. FIG. 4C shows dielectric layer 402 and hardmask 404 at the A-A' axis after conformal deposition of liner 406, and FIG. 4C' shows dielectric layer 402 and hardmask 404 at the B-B' axis after conformal deposition of liner 406. As can be seen, liner 406 is formed on the top surface of hardmask 404 and the bottom surface and the four sidewalls of the respective line trenches. In particular, FIG. 4C shows liner 406 deposited on the bottom surface and the two sidewalls defining the widths of the respective line trenches (e.g., the two sidewalls extending along the x-direction), and FIG. 4C' shows liner 406 deposited on the bottom surface and the two sidewalls defining the lengths of the respective line trenches (e.g., the two sidewalls extending along the y-direction). Any suitable deposition techniques, such as ALD, CVD, PVD, or any other suitable deposition process, can be used to conformally deposit liner 406. Note that portion(s) of liner 406 become the line end structure(s) as will be apparent and further described below. This allows the line end structures to be of a compositionally different material than the surrounding insulator material, such as the material of dielectric layer 402 and hardmask 404. As such, in some embodiments, liner 406 can include any suitable hard metal oxide such as $HfO_2$, $Al_2O_x$, $ZrO_x$, or any other suitable insulator material having relatively low leakage and/or lower etch rate.

The thickness of liner 406 can vary from one embodiment to the next, but in some example configurations, liner 406 has a relatively uniform thickness that is smaller than the thickness of line ends achievable using conventional single mask processes. In some embodiments, thickness of liner 406 is in a range of about 10 nm to 25 nm, although other configurations may be thicker or thinner, depending on the desired electrical properties. Furthermore, the thickness need not be perfectly uniform and may vary depending on the deposition process used. A uniform deposition may have a small variance in thickness over the length of the liner, such as the thinnest part of the liner being within 10% of the thickest part of the liner, in accordance with an embodiment. Other embodiments may have a tighter tolerance on the liner thickness, such as a 5% or 2% tolerance between the thinnest and thickest parts.

Figure 4D:
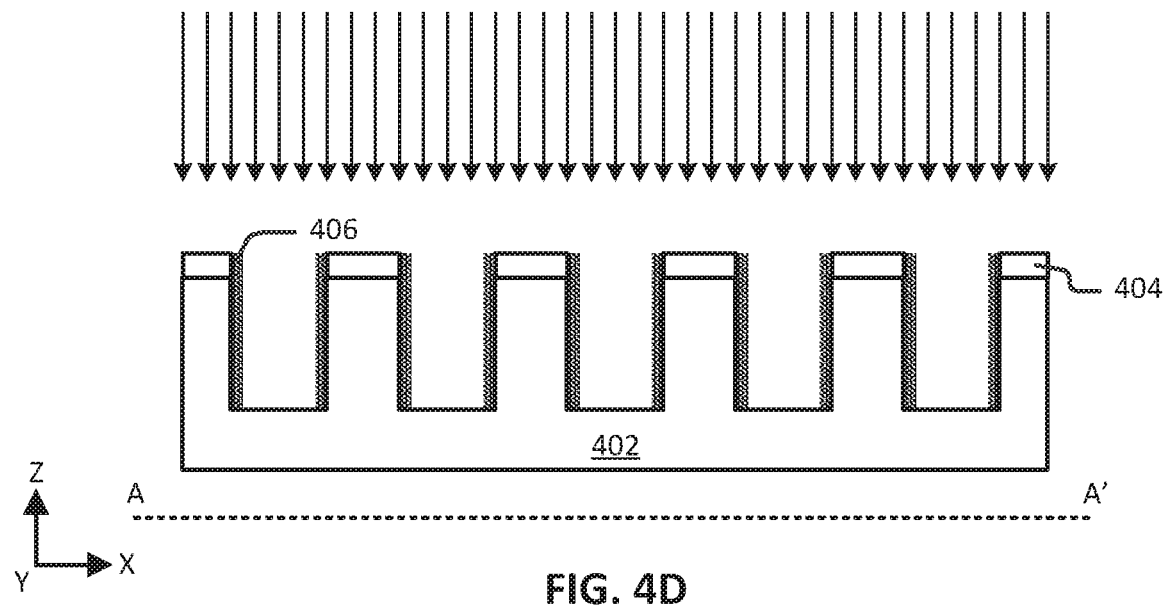
Figure 4D:
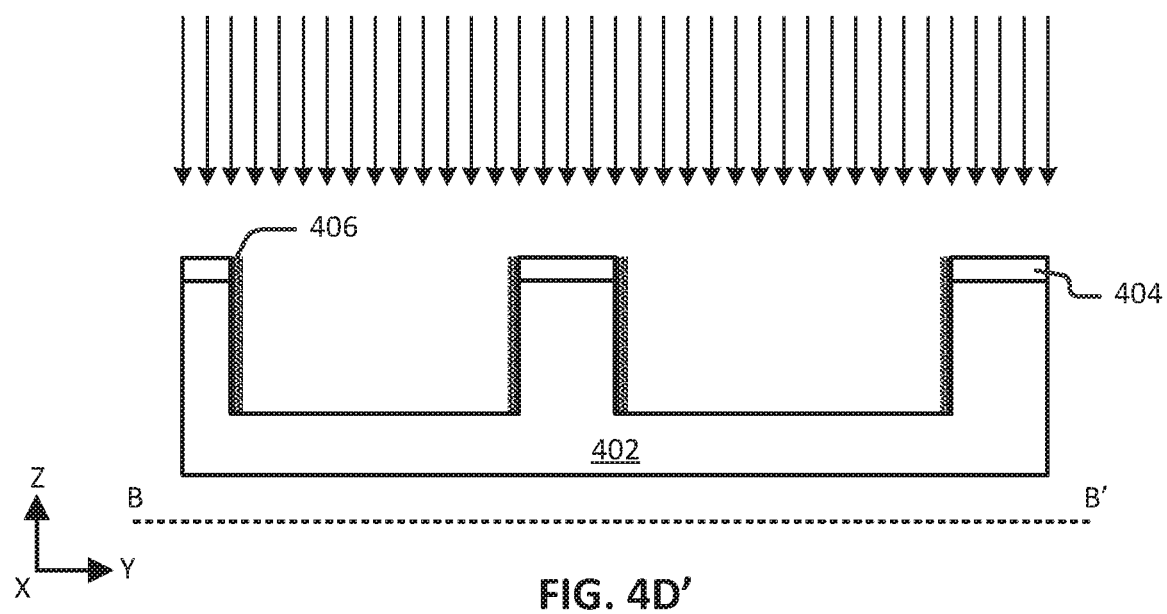

At block 308, an etch, such as a vertical etch for example, is performed to remove the horizontally deposited portions of liner 406. FIG. 4D shows dielectric layer 402 and hardmask 404 at the A-A' axis after removal of the horizontally deposited portions of liner 406, and FIG. 4D' shows dielectric layer 402 and hardmask 404 at the B-B' axis after removal of the horizontally deposited portions of liner 406. As can be seen from the absence of liner 406, the horizontally deposited portions of liner 406 are the portions of liner 406 that are formed on the top surface of hardmask 404 and the bottom surfaces of the line trenches. That is, the horizontally deposited portions of liner 406 are the laterally extending portions of liner 406. Any suitable etch processes (e.g., dry etch, wet etch, etc.) can be used to etch the horizontally deposited portions of liner 406. In some specific embodiments, a dry etch process, such as a plasma etch process, can be performed to selectively etch (e.g., remove) the horizontally deposited portions of liner 406 from the top surface of hardmask 404 and the bottom surfaces of the line trenches. In such example embodiments, a suitable etching species can be directed in a substantially vertical direction relative to the horizontal surface of dielectric layer 402 (as indicated by the downward pointing vertical arrows), thereby achieving selective etching of the horizontally deposited portions of liner 406.

Figure 4E:
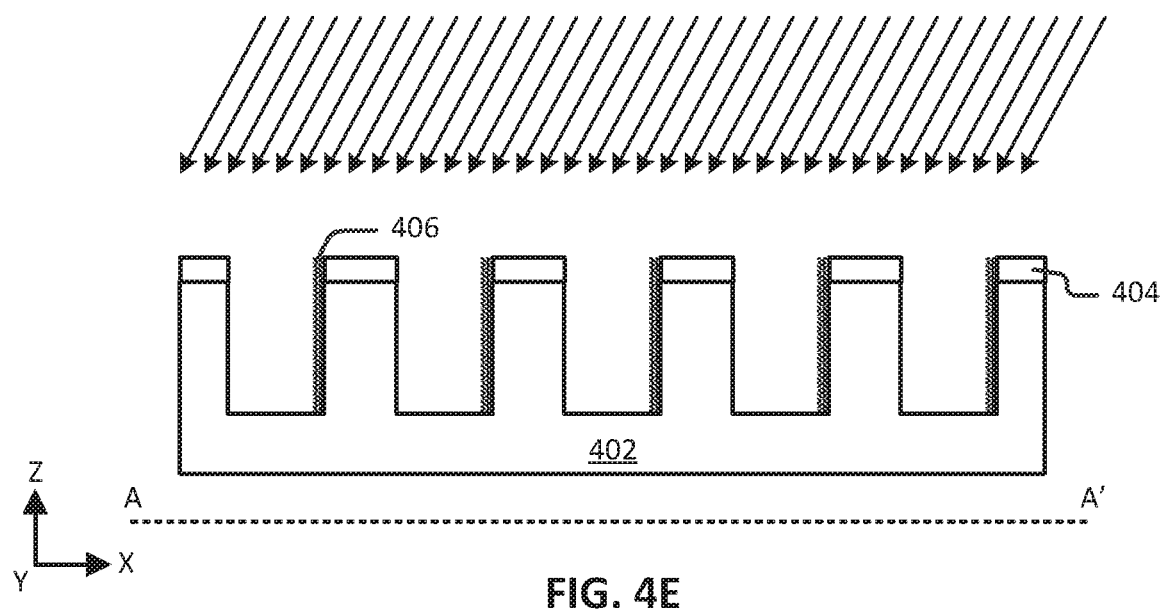
Figure 4E:
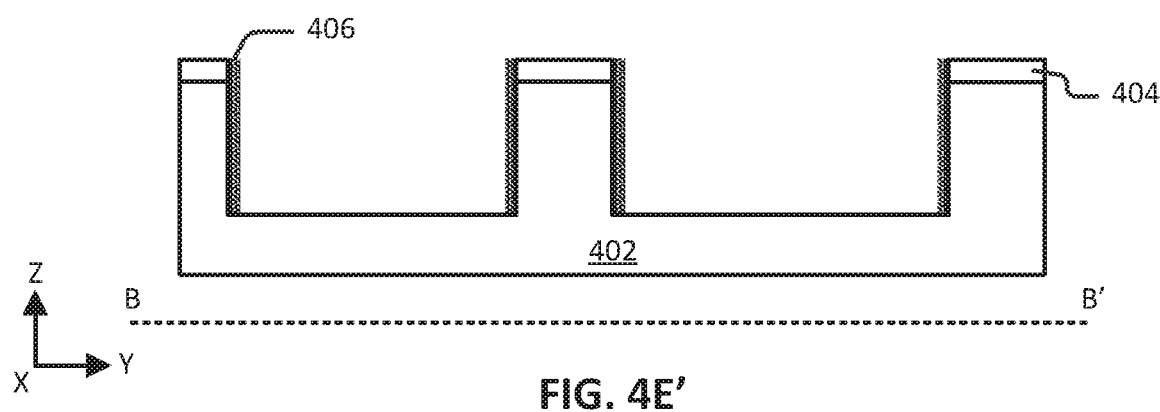

At block 310, a first angled etch is performed to remove liner 406 deposited on a first sidewall of the line trenches. FIG. 4E shows dielectric layer 402 and hardmask 404 at the A-A' axis after removal of liner 406 deposited on the first sidewall of the line trenches, and FIG. 4E' shows dielectric layer 402 and hardmask 404 at the B-B' axis after removal of liner 406 deposited on the first sidewall of the line trenches. As can be seen in FIG. 4E, the first angled etch can remove liner 406 from a left sidewall of the line trenches, which is one of the two sidewalls defining the lengths of the respective trenches (e.g., one of the two sidewalls extending along the y-direction), for example. Note that, as can be seen in FIGS. 4E and 4E', the first angled etch is performed so as to not (or only minimally) remove liner 406 deposited on the other three sidewalls of the line trenches.

In some embodiments, the angled etching process is a selective dry etching process that selectively etches liner 406 relative to dielectric layer 402. The selective dry etching process directs an etching species towards a horizontal surface of dielectric layer 402 using a first distribution of angles relative to a vertical plane (as indicated by the angled downward pointing vertical arrows shown in FIG. 4E), such as an x-z plane, substantially perpendicular to the horizontal surface of dielectric layer 402. In such example embodiments, the first distribution of angles can be in a range from 0° to about 30° relative to the vertical plane. In some specific such example embodiments, the first distribution of angles can be in a range from 0° to about 15°, 0° to about 20°, or 0° to about 25°, relative to the vertical plane. Various etching parameters can be tuned to generate etching species that travel according to a specified distribution of angles, such as etchant composition, etching temperature, etching time, etching pressure, etchant flow rate, electrical field distribution, particle motion energy, wafer tilting, and other etching parameters. In such implementations, the first distribution of angles can be modified based on factors such as the locations and dimensions (e.g., lengths, widths, and/or depths) of the line trenches in dielectric layer 402, the sizes of features laterally adjacent to the line trenches, etc., to remove the desired portions of liner 406.

Figure 4F:
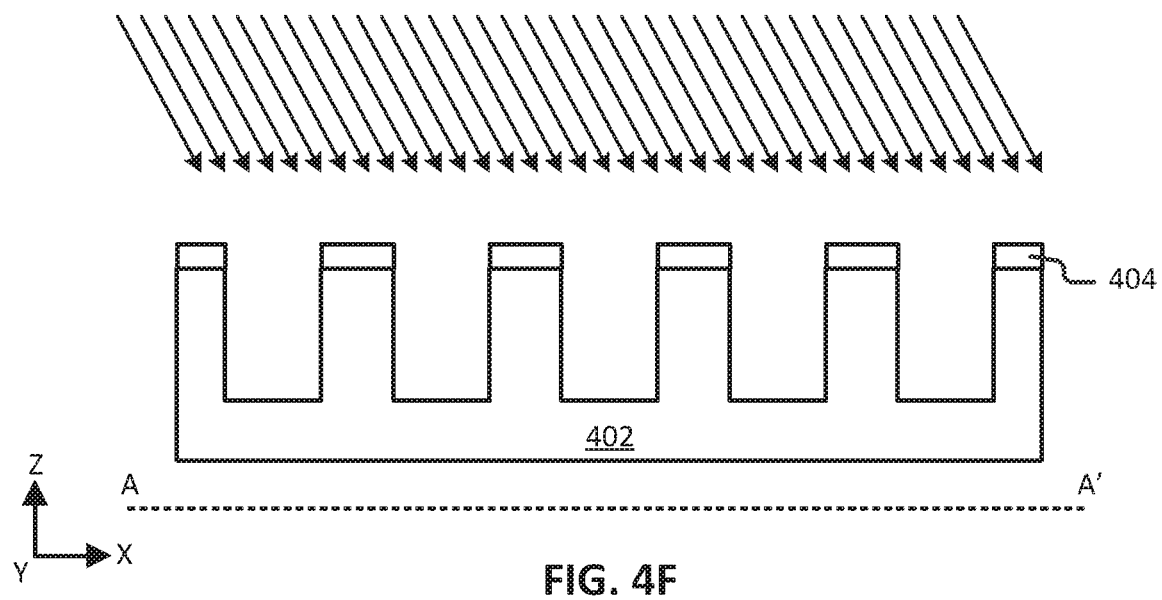
Figure 4F:
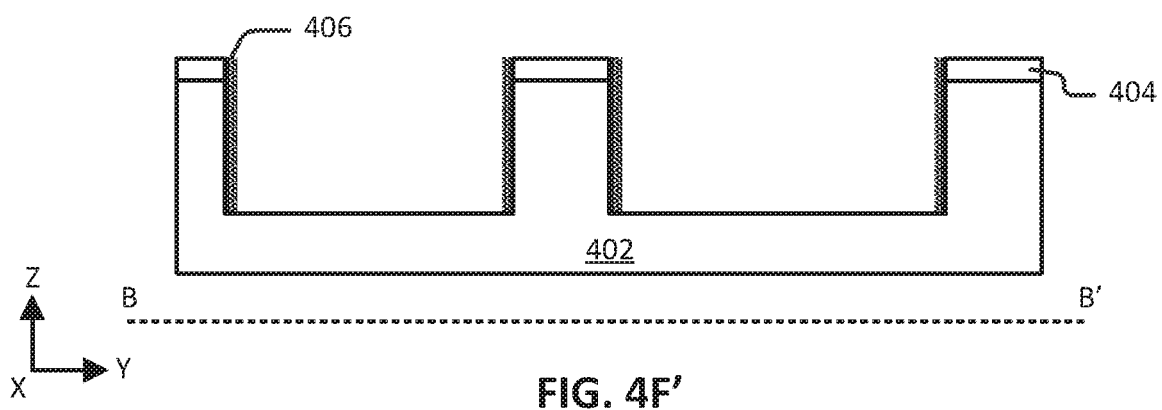

At block 312, a second angled etch is performed to remove liner 406 deposited on a second sidewall of the line trenches. FIG. 4F shows dielectric layer 402 and hardmask 404 at the A-A' axis after removal of liner 406 deposited on the second sidewall of the line trenches, and FIG. 4F' shows dielectric layer 402 and hardmask 404 at the B-B' axis after removal of liner 406 deposited on the second sidewall of the line trenches. As can be seen in FIG. 4F, the second angled etch can remove liner 406 from a right sidewall of the line trenches, which is one of the two sidewalls defining the lengths of the respective line trenches (e.g., one of the two sidewalls extending along the y-direction), for example. Note that, as can be seen in FIGS. 4F and 4F', the second angled etch is performed so as to not (or only minimally) remove liner 406 deposited on the other two sidewalls of the line trenches (e.g., the sidewalls extending along the x-direction) having liner 406. As explained above, the two sidewalls extending along the x-direction define the widths of the respective line trenches. In some embodiments, the second angled etch and the second distribution of angles is substantially similar to the first angled etch and the first distribution of angles, respectively, previously described, and that relevant discussion is equally applicable here.

Figure 4G:
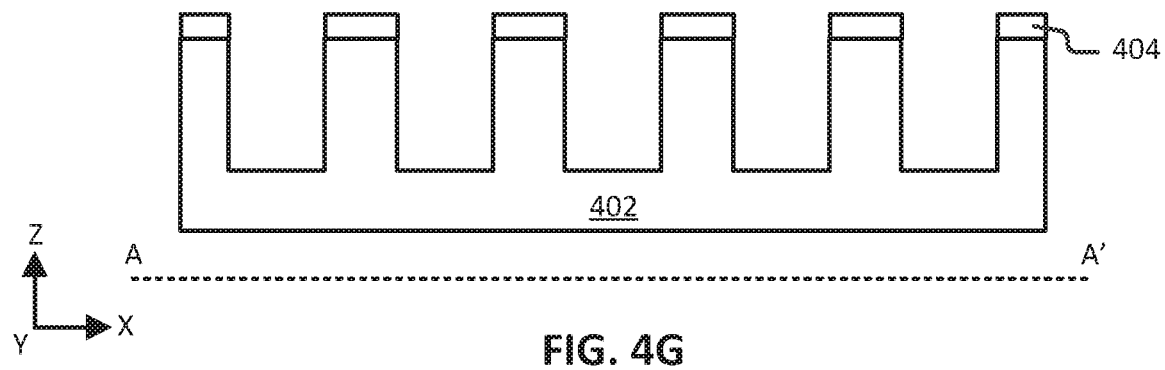
Figure 4G:
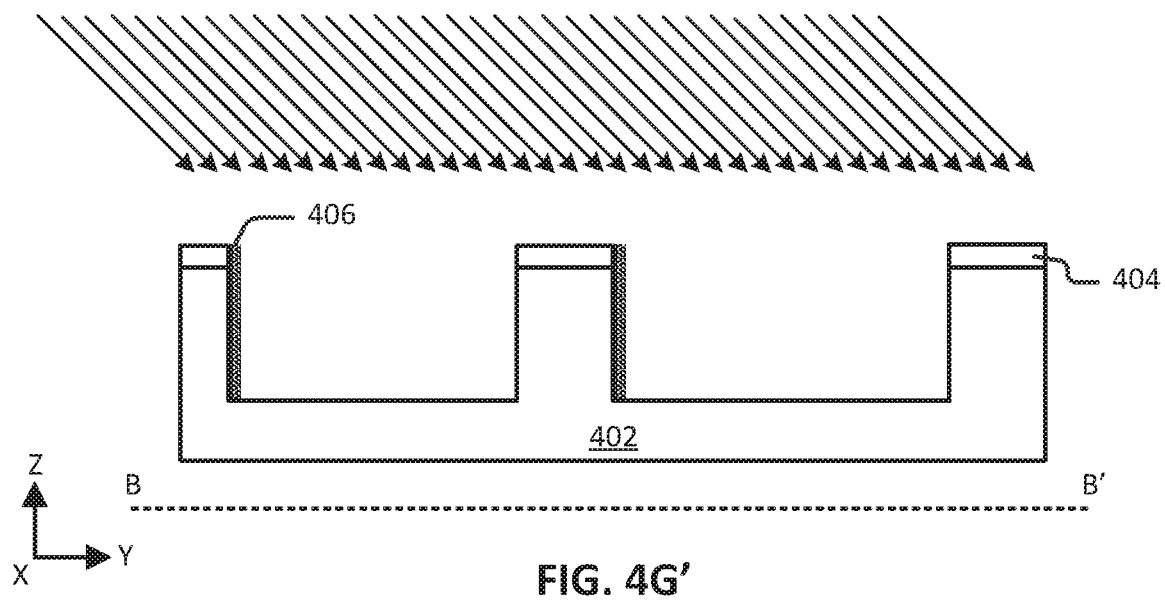

At block 314, a third angled etch is performed to remove liner 406 deposited on a third sidewall of the line trenches. FIG. 4G shows dielectric layer 402 and hardmask 404 at the A-A' axis after removal of liner 406 deposited on the third sidewall of the line trenches, and FIG. 4G' shows dielectric layer 402 and hardmask 404 at the B-B' axis after removal of liner 406 deposited on the third sidewall of the line trenches. As can be seen in FIG. 4G', the third angled etch can remove liner 406 from a right sidewall of the line trenches, which is one of the two sidewalls defining the widths of the respective line trenches (e.g., one of the two sidewalls extending along the x-direction), for example. Note that, as can be seen in FIGS. 4G and 4G', the third angled etch is performed so as to not (or only minimally) remove liner 406 deposited on the remaining sidewall of the line trenches (e.g., the other one of the two sidewalls extending along the x-direction and defining the width of the line trenches) having liner 406. In some embodiments, the third angled etch and the third distribution of angles is substantially similar to the first angled etch and the first distribution of angles, respectively, previously described, and that relevant discussion is equally applicable here.

Note that at this stage of process 300, liner 406 remains on one sidewall in each line trench. More specifically, liner 406 remains on the left sidewall at the end of the line trench relative to the length of the line trench extending along the y-direction. As can be seen, the left sidewall is one of the two shorter sidewalls of the line trench. As will be appreciated, liner 406 need not remain on the left sidewall in each line trench in all embodiments. For instance, in some embodiments, liner 406 can remain on any one of the other three sidewalls other than the left sidewall depending on the end use or target application of the line trenches, for example.

Figure 4H:
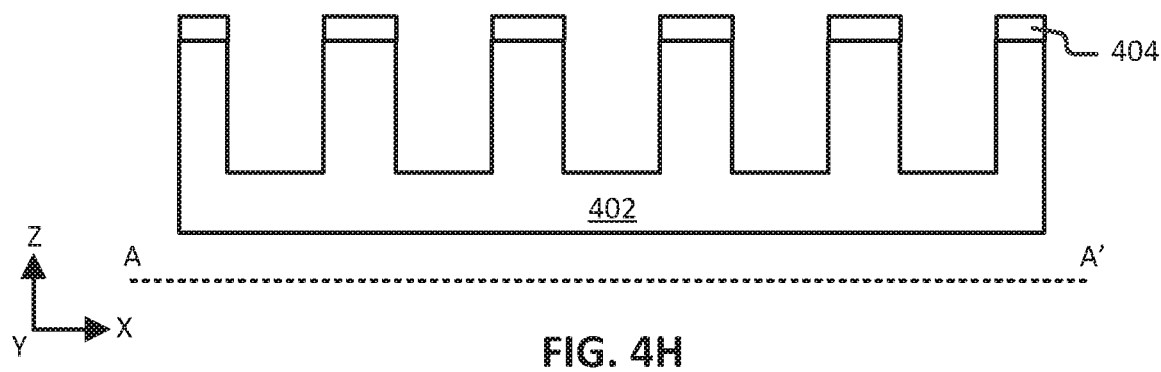
Figure 4H:
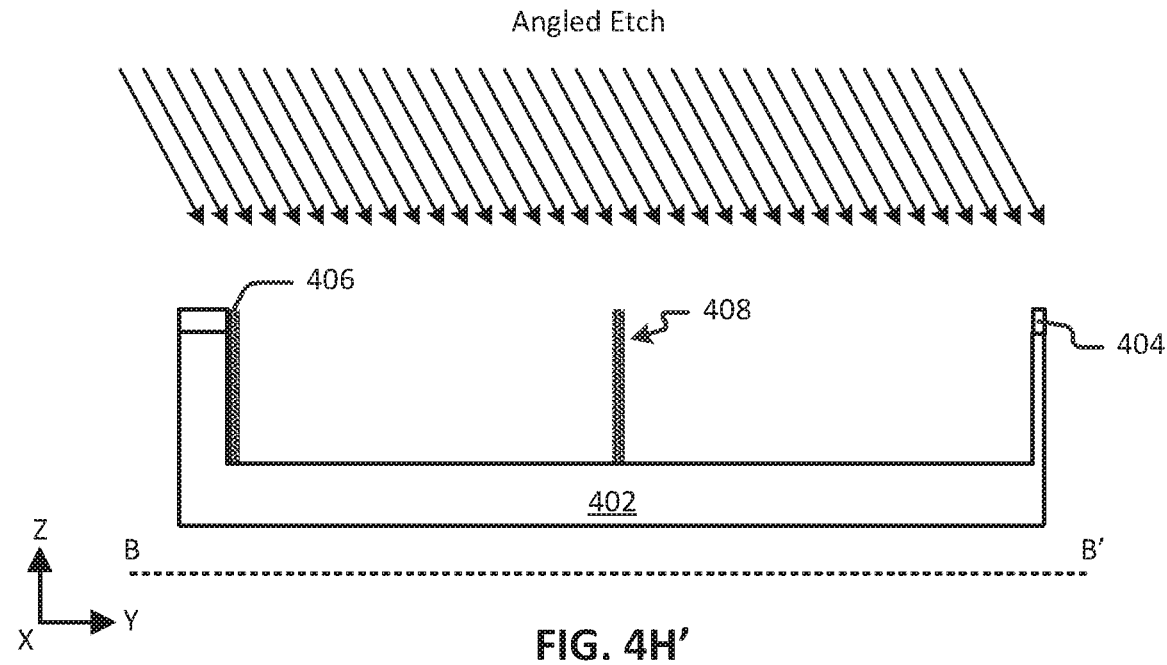

At block 316, hardmask 404 and interlayer dielectric 402 are etched to provide a line end structure 408. FIG. 4H shows dielectric layer 402 at the A-A' axis after the etching to provide line end structure 408, and FIG. 4H' shows dielectric layer 402 at the B-B' axis after the etching to provide line end structure 408. Any suitable etch processes (e.g., dry etch, wet etch, etc.) can be used to etch hardmask 404 and interlayer dielectric 402. In some specific embodiments, a dry etch process, such as a plasma etch process, can be performed to selectively etch (e.g., remove) hardmask 404 and interlayer dielectric 402. In such example embodiments, a suitable etching species can be directed in a substantially vertical direction relative to the horizontal surface of dielectric layer 402, thereby achieving selective etching of hardmask 404 and interlayer dielectric 402. As can be seen in FIG. 4H', the angled etch directs the etching species to remove the exposed sides of hardmask 404 and interlayer dielectric 402 opposite the sides laterally adjacent to liners 406. Note that, in such example embodiments, a liner that was laterally adjacent to the hardmask and the interlayer dielectric prior to removal of the hardmask and the interlayer dielectric is exposed or "freed" subsequent to the etching to provide a line end structure. As such, the provided line end structure is of a compositionally same material as the liner material. Also note that the etching of hardmask 404 and interlayer dielectric 402 laterally adjacent to liner 406 to provide line end structure 408, for instance, may not completely remove hardmask 404 and interlayer dielectric 406 laterally adjacent to other liners 406. For example, as can be seen in FIG. 4H', the etching of the hardmask and the interlayer dielectric to provide line end structure 408 does not completely remove the respective hardmask and interlayer dielectric on the left and the right of line end structure 408. This may be due to factors such as the size of the hardmask and the interlayer dielectric (e.g., length along y-direction) and/or the presence of any features laterally adjacent to the side of the hardmask and the interlayer dielectric opposite the side adjacent to liner 406, for example.

As can be seen, line end structure 408 is a body that defines an end-to-end space between the laterally adjacent ends of the two line trenches laterally adjacent to respective sides of line end structure 408. Note that the length (dimension in the y-direction) of line end structure 408 is the same as the width of the liner 406. That is, the length of line end structure 408 is determined by the width of liner 406 that provides line end structure 408. As such, in such example embodiments, the length of line end structure 408 is smaller than the lengths (e.g., thicknesses) of line end structure achievable using conventional single mask processes. In some embodiments, blocks 306-316 can be iterated one or more times to form a longer (e.g., dimension along the y-direction) line end structure 408 and/or additional line end structures, as desired.

Figure 5:
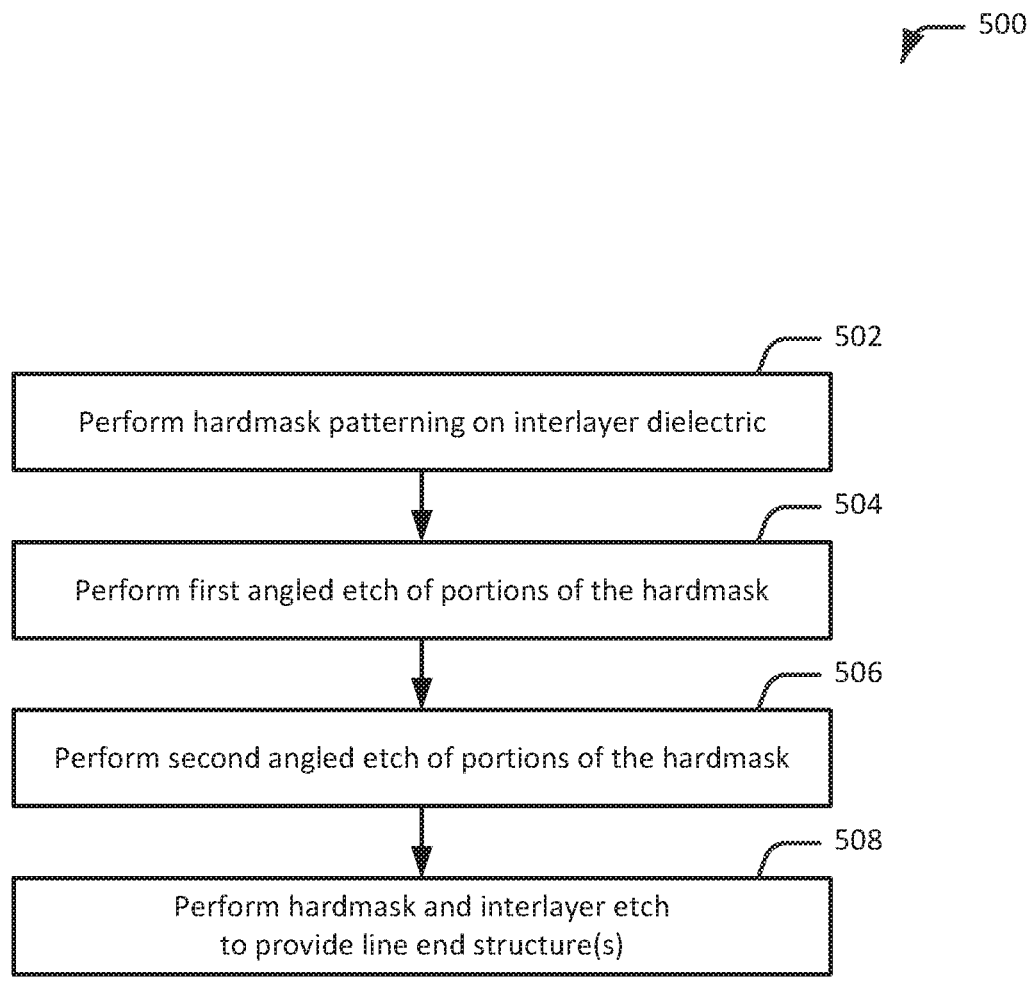
FIG. 5 is a flow diagram illustrating an example process for forming a line end structure, in accordance with an embodiment of the present disclosure.
Figure 6:
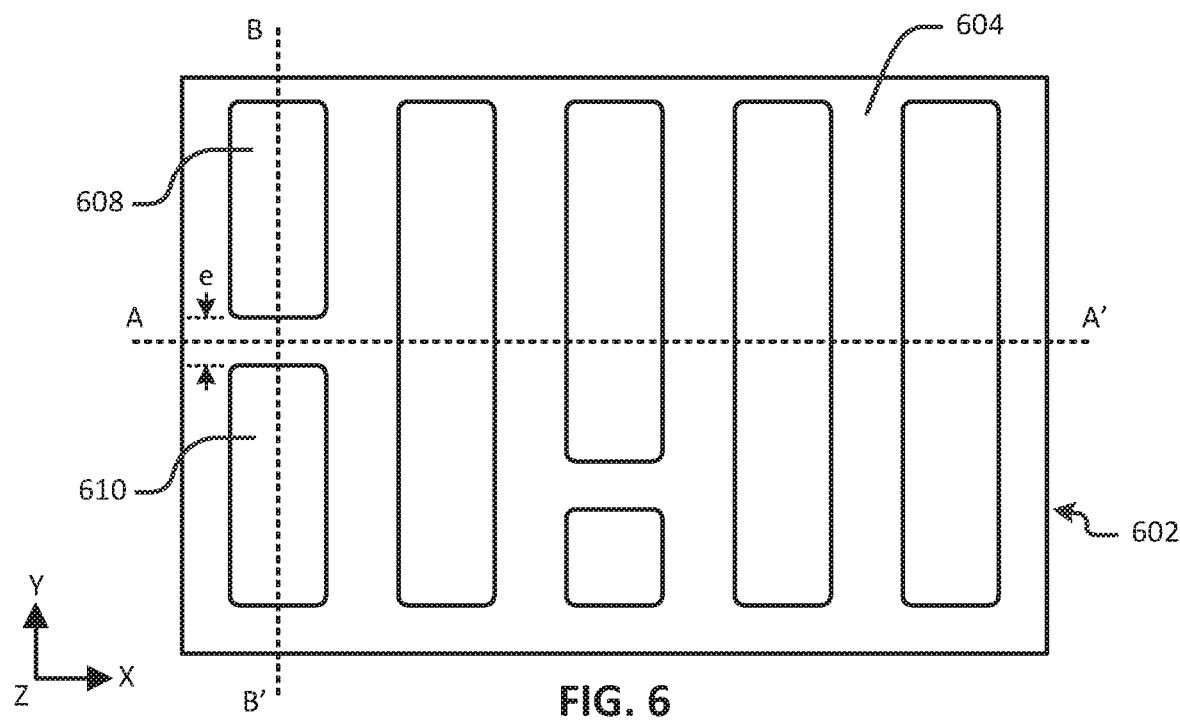
FIG. 6 illustrates a top view of an example integrated circuit structure that can be processed with the process of FIG. 5, in accordance with an embodiment of the present disclosure.
Figure 6A:
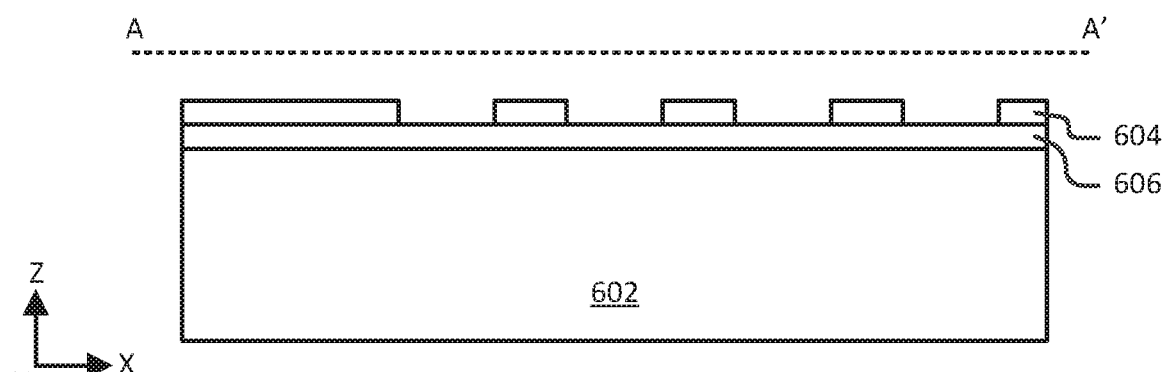
FIGS. 6A-6C illustrate cross-sectional views of the structure of FIG. 6 when carrying out the process of FIG. 5, in accordance with an embodiment of the present disclosure. The illustrated cross-sectional views are of the structure of FIG. 6 at the A-A' axis.
Figure 6A:
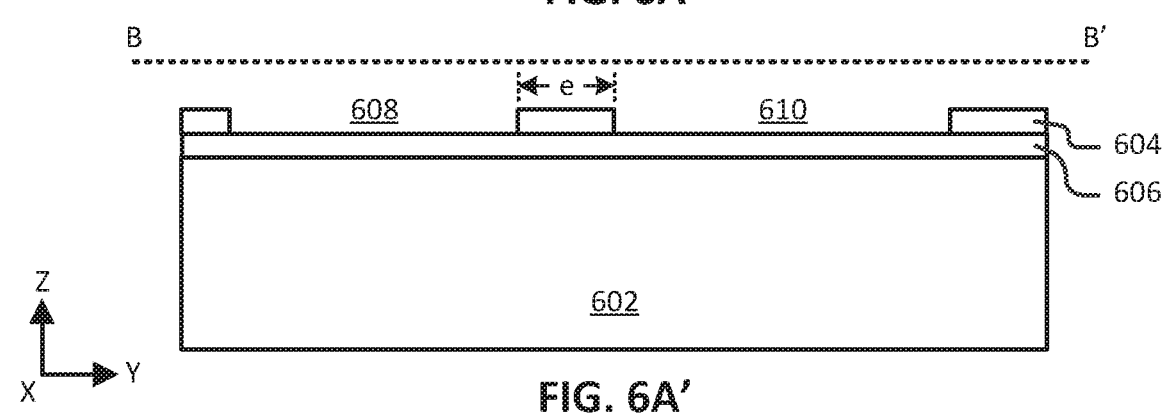
Figure 6B:
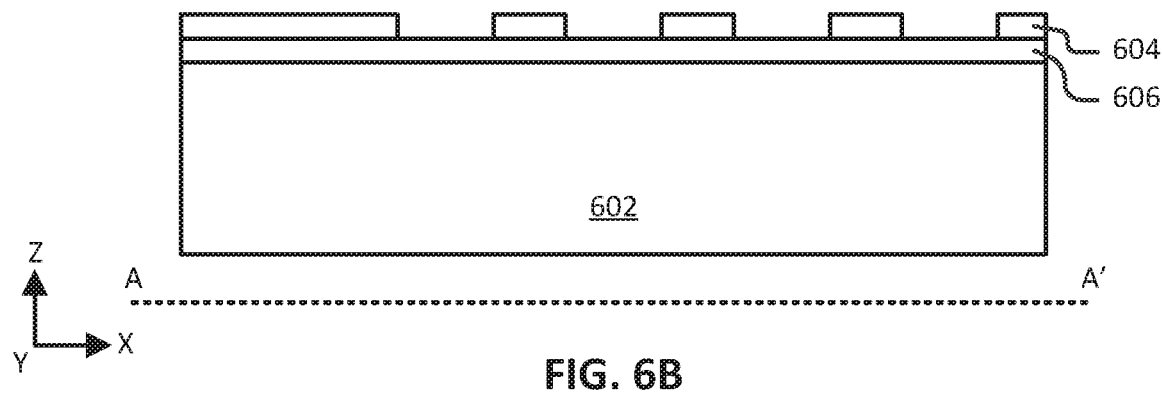
Figure 6B:
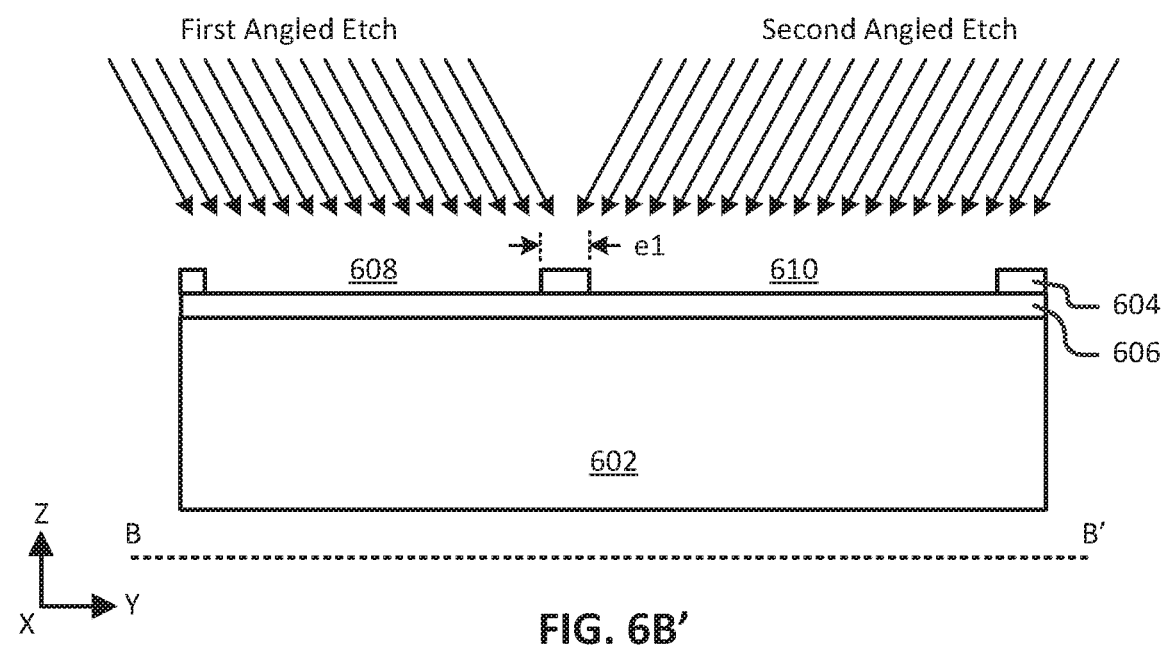
Figure 6C:
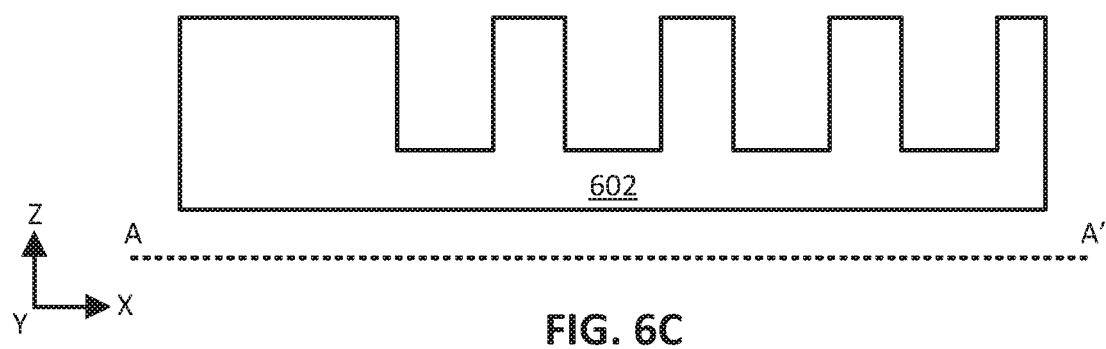
Figure 6C:
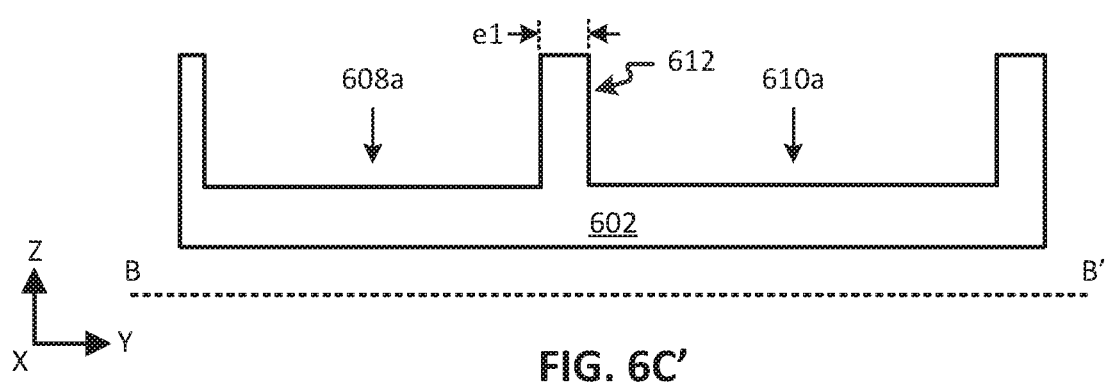

FIG. 5 is a flow diagram illustrating an example process 500 for forming a line end structure, in accordance with an embodiment of the present disclosure. FIG. 6 illustrates a top view of an example integrated circuit structure that can be processed with process 500 of FIG. 5, in accordance with an embodiment of the present disclosure. FIGS. 6A-6C illustrate cross-sectional views of the structure of FIG. 6 when carrying out process 500 of FIG. 5, in accordance with an embodiment of the present disclosure. The cross-sectional views illustrated in FIGS. 6A-6C are of the structure of FIG. 6 at the A-A' axis. FIGS. 6A'-6C' illustrate cross-sectional views of the structure of FIG. 6 when carrying out process 500 of FIG. 5, in accordance with an embodiment of the present disclosure. The cross-sectional views illustrated in FIGS. 6A'-6C' are of the structure of FIG. 6 at the B-B' axis. Concurrent reference to FIG. 5 and FIGS. 6, 6A-6C, and 6A'-6C' will facilitate explanation.

With reference to process 500 of FIG. 5, at block 502, hardmask patterning for line formation on an interlayer dielectric is performed. FIG. 6 shows a top view of an example dielectric layer or body 602, after this patterning, with a hardmask 604. FIG. 6A shows dielectric layer 602 at the A-A' axis after patterning with hardmask 604, and FIG. 6A' shows dielectric layer 602 at the B-B' axis after patterning with hardmask 604. As will be appreciated, dielectric layer 602 may be formed as part of, or otherwise on, a substrate and may be configured in a number of ways and using any number of materials, as will be appreciated in light of this disclosure. Dielectric layer 602 can include any suitable insulator material, such as a nitride, an oxide, an oxynitride, a carbide, an oxycarbide, a polymer, a silane, a siloxane, or other suitable insulator material. As can be seen, an optional hardmask 606 may be formed on dielectric layer 602, in some embodiments. In such embodiments, optional hardmask 606 can be formed on dielectric layer 602 using any number of suitable processes (e.g., blanket deposition) as normally done. Optional hardmask 606 may be employed, in some embodiments, to protect the underlying dielectric layer 602 during etching processes, for instance. In embodiments where optional hardmask 606 is present, as is the case in FIGS. 6A and 6A', hardmask 604 can be provisioned on hardmask 606 using any number of suitable processes as normally done. In embodiments where optional hardmask 606 is not present, hardmask 604 can be provisioned on dielectric layer 602. Patterning of hardmask 604 is substantially similar to patterning hardmask 404 previously described, and that relevant discussion is equally applicable here.

As can be seen in FIGS. 6 and 6A', hardmask 604 includes various hardmask features including adjacent hardmask features 608 and 610 that define interconnect lines to be formed on and/or in dielectric layer 602. An end-to-end space is defined between laterally adjacent ends of hardmask features 608 and 610, and the end-to-end space is of a length 'e' that extends in the y-direction. In particular, the end-to-end space defines a line end structure that is to separate the laterally adjacent ends of the to be formed lines defined by hardmask features 608 and 610. In some example embodiments, the length 'e' of the end-to-end space is a minimum length (e.g., size) achievable using conventional single mask processes, such as a single mask lithography process.

At block 504, a first angled etch is performed to remove portions of hardmask 604. For example, the first angled etch can be performed to remove portions of hardmask 604 defining a sidewall of hardmask feature 608 defining a line (which is also a sidewall of a line end structure) to reduce the length 'e' of the end-to-end space between laterally adjacent ends of hardmask features 608 and 610. Note that the first angled etch increases the length (e.g., dimension that extends in the y-direction) of hardmask feature 608. Also note that the first angled etch may remove other exposed portions of hardmask 604, such as other exposed sidewalls of hardmask features, for example. However, the first angled etch is performed so as to not (or only minimally) affect the width (e.g., dimension that extends in the x-direction) of hardmask feature 608.

At block 506, an optional second angled etch may be performed to remove portions of hardmask 604. For example, the second angled etch can be performed to remove portions of hardmask 604 defining a sidewall of hardmask feature 610 defining a line (which is also a sidewall of the line end feature laterally opposite the sidewall etched at block 504) to reduce the length 'e' of the end-to-end space between laterally adjacent ends of hardmask features 608 and 610. Note that the optional second angled etch reduces the length of the end-to-end space from a laterally opposite side (e.g., direction) than that reduced by the first angled etch. Note that the second angled etch increases the length (e.g., dimension that extends in the y-direction) of hardmask feature 610. Also note that the second angled etch may remove other exposed portions of hardmask 604, such as other exposed sidewalls of hardmask features, for example. However, the second angled etch is performed so as to not (or only minimally) affect the width (e.g., dimension that extends in the x-direction) of hardmask feature 610.

As can be seen in FIG. 6B', the first angled etch and the optional second angled etch removes hardmask 604 to reduce the length of the end-to-end space between the laterally adjacent ends of hardmask features 608 and 610 from a length 'e' to a length 'e1', where 'e1'<'e'. Accordingly, the length of the line end structure defined by the end-to-end space is reduced from a length 'e' to a length 'e1', where 'e1'<'e'. In such example embodiments, since the length 'e' of the end-to-end space is a minimum length (e.g., size) achievable using conventional single mask processes, the length 'e1' is shorter than that achievable using conventional single mask processes.

Also, as can be seen in FIG. 6B, the first angled etch and the optional second angled etch does not (or only minimally) affect the x-direction dimensions (e.g., widths) of the hardmask features, including the widths of hardmask features 608 and 610. Note however that, in some embodiments, the first and optional second angled etches can be performed to remove portions of hardmask 604 defining a sidewall of a hardmask feature to increase the width (e.g., dimension in the x-direction) of a hardmask feature while not (or only minimally) affecting the length (e.g., dimension in the y-direction) of the hardmask feature. As such, in a more general sense, the first and optional second angled etches provide control of the y-direction dimension, such as the y-direction dimensions of hardmask features, independent of the x-direction dimension, such as the x-direction dimensions of hardmask features, and vice versa.

At block 508, hardmask 604, optional hardmask 606 if present, and interlayer dielectric 602 are etched to provide a line end structure 612. FIG. 6C shows dielectric layer 602 at the A-A' axis after the etching to provide line end structure 612, and FIG. 6C' shows dielectric layer 602 at the B-B' axis after the etching to provide line end structure 612, a line trench 608a, and a line trench 610a. Line trench 608a is formed as defined by hardmask feature 608, and line trench 610a is formed as defined by hardmask feature 610. Any suitable etch processes (e.g., dry etch, wet etch, etc.) can be used to etch hardmask 604, optional hardmask 606 if present, and interlayer dielectric 602. As can be seen, the length 'e1' (dimension in the y-direction) of line end structure 602 is the same as the length 'e1' of the end-to-end space between laterally adjacent ends of hardmask features 608 and 610 after the first and optional second etches. That is, the length of line end structure 602 is determined by the final length of the end-to-end space (the length of the end-to-end space after the angled etching of the hardmask) that provides line end structure 602. As such, in such example embodiments, the length of line end structure 602 is smaller than the lengths of line end structures achievable using conventional single mask processes.

Example System

Figure 7:
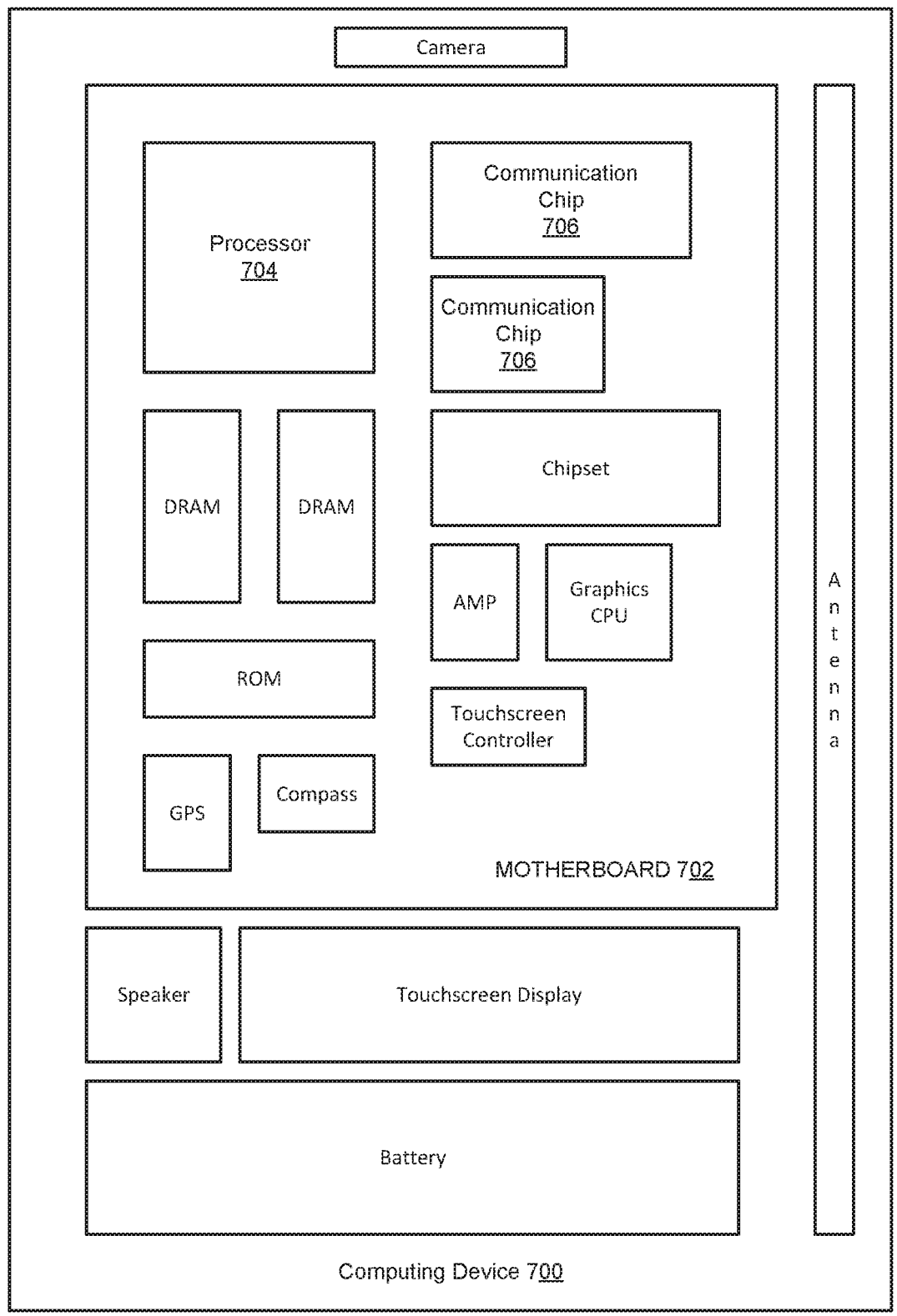
FIG. 7 is an example computing system implemented with one or more of the integrated circuit structures as disclosed herein, in accordance with an embodiment of the present disclosure.

FIG. 7 is an example computing system 700 implemented with one or more of the integrated circuit structures as disclosed herein, in accordance with an embodiment of the present disclosure. As can be seen, computing system 700 houses a motherboard 702. Motherboard 702 may include a number of components, including, but not limited to, a processor 704 and at least one communication chip 706, each of which can be physically and electrically coupled to motherboard 702, or otherwise integrated therein. As will be appreciated, motherboard 702 may be, for example, any printed circuit board, whether a main board, a daughterboard mounted on a main board, or the only board of system 700, etc.

Depending on its applications, computing system 700 may include one or more other components that may or may not be physically and electrically coupled to motherboard 702. These other components may include, but are not limited to, volatile memory (e.g., DRAM), non-volatile memory (e.g., read only memory (ROM)), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 700 may include one or more integrated circuit structures or devices configured in accordance with an example embodiment (e.g., to include one or more semiconductor structures including line end structures of minimal size and/or compositionally different materials, as variously provided herein). In some embodiments, multiple functions can be integrated into one or more chips (e.g., for instance, note that communication chip 706 can be part of or otherwise integrated into processor 704).

Communication chip 706 enables wireless communications for the transfer of data to and from computing system 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 706 may implement any of a number of wireless standards or protocols, including, but not limited to, Wi-Fi (Institute of Electrical and Electronics Engineers (IEEE) 802.11 family), worldwide interoperability for microwave access (WiMAX) (IEEE 802.16 family), IEEE 802.20, long term evolution (LTE), 1x evolution-data optimized (Ev-DO), high speed packet access (HSPA+), high speed downlink packet access (HSDPA+), high speed uplink packet access (HSUPA+), enhanced data rates for GSM evolution (EDGE), global system for mobile communication (GSM), general packet radio service (GPRS), code division multiple access (CDMA), time division multiple access (TDMA), digital enhanced cordless telecommunications (DECT), Bluetooth, derivatives thereof, as well as any other wireless protocols that are designated as 3G, 4G, 5G, and beyond. Computing system 700 may include multiple communication chips 706. For instance, a first communication chip 706 may be dedicated to shorter range wireless communications such as Wi-Fi and Bluetooth, and a second communication chip 706 may be dedicated to longer range wireless communications such as GPS, EDGE, GPRS, CDMA, WiMAX, LTE, Ev-DO, and others. In some embodiments, communication chip 706 may include one or more semiconductor structures including line end structures of minimal size and/or compositionally different materials as various described herein.

Processor 704 of computing system 700 includes an integrated circuit die packaged within processor 704. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

Communication chip 706 also may include an integrated circuit die packaged within communication chip 706. In accordance with some such example embodiments, the integrated circuit die of the communication chip includes one or more integrated circuit structures or devices formed using the disclosed techniques, as variously described herein. As will be appreciated in light of this disclosure, note that multi-standard wireless capability may be integrated directly into processor 704 (e.g., where functionality of any chips 706 is integrated into processor 704, rather than having separate communication chips). Further note that processor 704 may be a chip set having such wireless capability. In short, any number of processor 704 and/or communication chips 706 can be used. Likewise, any one chip or chip set can have multiple functions integrated therein.

In various implementations, computing system 700 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 includes an integrated circuit structure including: a first line trench in a body of insulator material; a second line trench in the body of insulator material, the second line trench having an end that is laterally adjacent to an end of the first line trench; and a line end structure between the end of the first line and the end of the second line, wherein the line end structure is of a compositionally different material than the body of insulator material.

Example 2 includes the subject matter of Example 1, wherein a length from a first side of the line end structure to an opposing second side of the line end structure is 25 nm, or less, the first side being proximate the end of the first line trench, and the second side being proximate the end of the second line trench.

Example 3 includes the subject matter of Example 1, wherein a length from a first side of the line end structure to an opposing second side of the line end structure is 24 nm, or less, the first side being proximate the end of the first line trench, and the second side being proximate the end of the second line trench.

Example 4 includes the subject matter of Example 1, wherein a length from a first side of the line end structure to an opposing second side of the line end structure is 23 nm, or less, the first side being proximate the end of the first line trench, and the second side being proximate the end of the second line trench.

Example 5 includes the subject matter of Example 1, wherein a length from a first side of the line end structure to an opposing second side of the line end structure is 22 nm, or less, the first side being proximate the end of the first line trench, and the second side being proximate the end of the second line trench.

Example 6 includes the subject matter of Example 1, wherein a length from a first side of the line end structure to an opposing second side of the line end structure is 21 nm, or less, the first side being proximate the end of the first line trench, and the second side being proximate the end of the second line trench.

Example 7 includes the subject matter of Example 1, wherein a length from a first side of the line end structure to an opposing second side of the line end structure is 20 nm, or less, the first side being proximate the end of the first line trench, and the second side being proximate the end of the second line trench.

Example 8 includes the subject matter of Example 1, wherein a length from a first side of the line end structure to an opposing second side of the line end structure is 19 nm, or less, the first side being proximate the end of the first line trench, and the second side being proximate the end of the second line trench.

Example 9 includes the subject matter of Example 1, wherein a length from a first side of the line end structure to an opposing second side of the line end structure is 18 nm, or less, the first side being proximate the end of the first line trench, and the second side being proximate the end of the second line trench.

Example 10 includes the subject matter of Example 1, wherein a length from a first side of the line end structure to an opposing second side of the line end structure is 17 nm, or less, the first side being proximate the end of the first line trench, and the second side being proximate the end of the second line trench.

Example 11 includes the subject matter of Example 1, wherein a length from a first side of the line end structure to an opposing second side of the line end structure is 16 nm, or less, the first side being proximate the end of the first line trench, and the second side being proximate the end of the second line trench.

Example 12 includes the subject matter of Example 1, wherein a length from a first side of the line end structure to an opposing second side of the line end structure is 15 nm, or less, the first side being proximate the end of the first line trench, and the second side being proximate the end of the second line trench.

Example 13 includes the subject matter of Example 1, wherein a length from a first side of the line end structure to an opposing second side of the line end structure is 14 nm, or less, the first side being proximate the end of the first line trench, and the second side being proximate the end of the second line trench.

Example 14 includes the subject matter of Example 1, wherein a length from a first side of the line end structure to an opposing second side of the line end structure is 13 nm, or less, the first side being proximate the end of the first line trench, and the second side being proximate the end of the second line trench.

Example 15 includes the subject matter of Example 1, wherein a length from a first side of the line end structure to an opposing second side of the line end structure is 12 nm, or less, the first side being proximate the end of the first line trench, and the second side being proximate the end of the second line trench.

Example 16 includes the subject matter of Example 1, wherein a length from a first side of the line end structure to an opposing second side of the line end structure is 11 nm, or less, the first side being proximate the end of the first line trench, and the second side being proximate the end of the second line trench.

Example 17 includes the subject matter of any of Examples 1 through 16, wherein the line end structure includes hafnium and oxygen.

Example 18 includes the subject matter of any of Examples 1 through 16, wherein the line end structure includes aluminum and oxygen.

Example 19 includes the subject matter of any of Examples 1 through 16, wherein the line end structure includes zirconium and oxygen.

Example 20 includes the subject matter of any of Examples 1 through 19, wherein the line end structure includes an insulator material compositionally different than the body of insulator material.

Example 21 includes the subject matter of any of Examples 1 through 20, wherein the line end structure has a slower etch rate than the body of insulator material, for a given etch chemistry.

Example 22 includes a method for forming an integrated circuit structure, the method including: forming a first line trench in a body of insulator material, the first line trench having a first, second, third, and fourth sidewalls and a bottom; conformally depositing a liner on the sidewalls and the bottom of the first line trench, wherein the liner body is of a compositionally different material than the body of insulator material; performing a vertical etch to remove laterally extending portions of the liner; performing a first angled etch to remove the liner deposited on a first sidewall of the first line trench; performing a second angled etch to remove the liner deposited on a second sidewall of the first line trench; performing a third angled etch to remove the liner deposited on a third sidewall of the first line trench; and removing the insulator material laterally adjacent to the liner deposited on the fourth sidewall of the first line trench, such that the liner body is exposed to provide a line end structure at an end of the first line trench, the line end structure between the end of the first line trench and a laterally adjacent end of a second line trench.

Example 23 includes the subject matter of Example 22, wherein the first line trench is formed using a single mask.

Example 24 includes the subject matter of any of Examples 22 and 23, wherein a length of the line end structure is between 20 nm and 10 nm.

Example 25 includes the subject matter of any of Examples 22 through 24, wherein the liner includes oxygen and hafnium.

Example 26 includes the subject matter of any of Examples 22 through 24, wherein the liner includes oxygen and aluminum.

Example 27 includes the subject matter of any of Examples 22 through 24, wherein the liner includes oxygen and zirconium.

Example 28 includes the subject matter of any of Examples 22 through 27, wherein the liner includes an insulator material compositionally different than the body of insulator material.

Example 29 includes the subject matter of any of Examples 22 through 28, wherein the liner has a slower etch rate than the body of insulator material.

Example 30 includes the subject matter of any of Examples 22 through 29, wherein a thickness of the liner is uniform, such that a thinnest part of the liner is within 5% of a thickest part of the liner.

Example 31 includes a method for forming an integrated circuit structure, the method including: forming a body of insulator material having a hardmask thereon using a single mask, the hardmask including a first hardmask feature and a second hardmask feature, the first and second hardmask features defining respective first and second lines; performing a first angled etch to remove portions of a first sidewall of the first hardmask feature, wherein removing portions of the first sidewall decreases a length of an end-to-end space between laterally adjacent ends of the first and second hardmask features; and performing an etch to form a plurality of structures therein, the plurality of structures including a first line trench corresponding to the first line, a second line trench corresponding to the second line, and a line end structure defined by the end-to-end space.

Example 32 includes the subject matter of Example 31, further including performing a second angled etch to remove portions of a second sidewall of the second hardmask feature, wherein removing portions of the second sidewall decreases the length of the end-to-end space between laterally adjacent ends of the first and second hardmask features.

Example 33 includes the subject matter of any of Examples 31 and 32, wherein the length of the end-to-end space is between 25 nm and 10 nm.

Example 34 includes the subject matter of any of Examples 31 and 32, wherein the length of the end-to-end space is 17 nm, or less.

Example 35 includes the subject matter of any of Examples 31 and 32, wherein the length of the end-to-end space is 14 nm, or less.

Example 36 includes the subject matter of any of Examples 31 through 35, further including depositing metal into the first and second line trenches.

Terms used in the present disclosure and in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

All examples and conditional language recited in the present disclosure are intended for pedagogical examples to aid the reader in understanding the present disclosure, and are to be construed as being without limitation to such specifically recited examples and conditions. Although embodiments of the present disclosure have been described in detail, various changes, substitutions, and alterations could be made hereto without departing from the spirit and scope of the present disclosure. Accordingly, it is intended that the scope of the present disclosure be limited not by this detailed description, but rather by the claims appended hereto.

What is claimed is:

1. An integrated circuit structure, comprising:
a first line trench in a body of insulator material, the first line trench having a bottom surface and a top surface;
a second line trench in the body of insulator material, the second line trench having an end that is laterally adjacent to an end of the first line trench, and the second line trench having a bottom surface and a top surface; and
a line end structure between the end of the first line trench and the end of the second line trench, wherein the line end structure comprises a compositionally different material than the body of insulator material, wherein the compositionally different material of the line end structure has a bottom surface co-planar with the bottom surface of the first line trench and co-planar with the bottom surface of the second line trench, wherein the compositionally different material of the line end structure has a top surface co-planar with the top surface of the first line trench and co-planar with the top surface of the second line trench, and wherein the compositionally different material is a single material continuous from the bottom surface to the top surface of the line end structure.

2. The integrated circuit of claim 1, wherein a length from a first side of the line end structure to an opposing second side of the line end structure is 20 nm, or less, the first side being proximate the end of the first line trench, and the second side being proximate the end of the second line trench.

3. The integrated circuit of claim 1, wherein a length from a first side of the line end structure to an opposing second side of the line end structure is 13 nm, or less, the first side being proximate the end of the first line trench, and the second side being proximate the end of the second line trench.

4. The integrated circuit of claim 1, wherein a length from a first side of the line end structure to an opposing second side of the line end structure is 18 nm, or less, the first side being proximate the end of the first line trench, and the second side being proximate the end of the second line trench.

5. The integrated circuit of claim 1, wherein a length from a first side of the line end structure to an opposing second side of the line end structure is 15 nm, or less, the first side being proximate the end of the first line trench, and the second side being proximate the end of the second line trench.

6. The integrated circuit of claim 1, wherein the compositionally different material of the line end structure includes hafnium and oxygen.

7. The integrated circuit of claim 1, wherein the compositionally different material of the line end structure includes aluminum and oxygen.

8. The integrated circuit of claim 1, wherein the compositionally different material of the line end structure includes zirconium and oxygen.

9. The integrated circuit of claim 1, wherein the compositionally different material of the line end structure includes an insulator material.

10. The integrated circuit of claim 1, wherein the line end structure has a slower etch rate than the body of insulator material, for a given etch chemistry.

11. A method for forming an integrated circuit structure, the method comprising:
    forming a first line trench in a body of insulator material, the first line trench having a first, second, third, and fourth sidewalls and a bottom;
    conformally depositing a liner on the sidewalls and the bottom of the first line trench, wherein the liner body is of a compositionally different material than the body of insulator material;
    performing a vertical etch to remove laterally extending portions of the liner;
    performing a first angled etch to remove the liner deposited on a first sidewall of the first line trench;
    performing a second angled etch to remove the liner deposited on a second sidewall of the first line trench;
    performing a third angled etch to remove the liner deposited on a third sidewall of the first line trench; and
    removing the insulator material laterally adjacent to the liner deposited on the fourth sidewall of the first line trench, such that the liner body is exposed to provide a line end structure at an end of the first line trench, the line end structure between the end of the first line trench and a laterally adjacent end of a second line trench.

12. The method of claim 11, wherein the first line trench is formed using a single mask.

13. The method of claim 11, wherein a length of the line end structure is between 20 nm and 10 nm.

14. The method of claim 11, wherein the liner includes oxygen and hafnium.

15. The method of claim 11, wherein the liner includes oxygen and aluminum.

16. The method of claim 11, wherein the liner includes oxygen and zirconium.

17. The method of claim 13, wherein the liner includes an insulator material compositionally different than the body of insulator material.

18. The method of claim 13, wherein the liner has a slower etch rate than the body of insulator material.

19. The method of claim 13, wherein a thickness of the liner is uniform, such that a thinnest part of the liner is within 5% of a thickest part of the liner.

20. A method for forming an integrated circuit structure, the method comprising:
    forming a body of insulator material having a hardmask thereon using a single mask, the hardmask including a first hardmask feature and a second hardmask feature, the first and second hardmask features defining respective first and second lines;
    performing a first angled etch to remove portions of a first sidewall of the first hardmask feature, wherein removing portions of the first sidewall decreases a length of an end-to-end space between laterally adjacent ends of the first and second hardmask features; and
    performing an etch to form a plurality of structures therein, the plurality of structures including a first line trench corresponding to the first line, a second line trench corresponding to the second line, and a line end structure defined by the end-to-end space.

21. The method of claim 20, further comprising performing a second angled etch to remove portions of a second sidewall of the second hardmask feature, wherein removing portions of the second sidewall decreases the length of the end-to-end space between laterally adjacent ends of the first and second hardmask features.

22. The method of claim 20, wherein the length of the end-to-end space is between 25 nm and 10 nm.

23. The method of claim 20, wherein the length of the end-to-end space is 17 nm, or less.

24. The method of claim 20, wherein the length of the end-to-end space is 14 nm, or less.

25. The method of claim 20, further comprising depositing metal into the first and second line trenches.

26. An integrated circuit structure, comprising:
    a first line trench in a body of insulator material;
    a second line trench in the body of insulator material, the second line trench having an end that is laterally adjacent to an end of the first line trench; and
    a line end structure between the end of the first line trench and the end of the second line trench, wherein the line end structure is of a compositionally different material than the body of insulator material, and wherein the line end structure includes hafnium and oxygen.

27. An integrated circuit structure, comprising:
a first line trench in a body of insulator material;
a second line trench in the body of insulator material, the second line trench having an end that is laterally adjacent to an end of the first line trench; and
a line end structure between the end of the first line trench and the end of the second line trench,
wherein the line end structure is of a compositionally different material than the body of insulator material, and wherein the line end structure includes aluminum and oxygen.

28. An integrated circuit structure, comprising:
a first line trench in a body of insulator material;
a second line trench in the body of insulator material, the second line trench having an end that is laterally adjacent to an end of the first line trench; and
a line end structure between the end of the first line trench and the end of the second line trench,
wherein the line end structure is of a compositionally different material than the body of insulator material, and wherein the line end structure includes zirconium and oxygen.

* * * * *